(12) United States Patent
Yeh et al.

(10) Patent No.: US 12,027,419 B2
(45) Date of Patent: Jul. 2, 2024

(54) SEMICONDUCTOR DEVICE INCLUDING LINER STRUCTURE

(71) Applicant: Taiwan Semiconductor Manufacturing Company Limited, Hsinchu (TW)

(72) Inventors: Ching-Fu Yeh, Hsinchu (TW); Yu-Chen Chan, Taichung (TW); Guanyu Luo, Hsinchu (TW); Meng-Pei Lu, Hsinchu (TW); Chao-Hsien Peng, Zhubei (TW); Shin-Yi Yang, New Taipei (TW); Ming-Han Lee, Taipei (TW); Andy Li, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 16/912,284

(22) Filed: Jun. 25, 2020

(65) Prior Publication Data

US 2021/0407852 A1 Dec. 30, 2021

(51) Int. Cl.
*H01L 21/768* (2006.01)
*H01L 23/522* (2006.01)
*H01L 23/532* (2006.01)

(52) U.S. Cl.
CPC .. *H01L 21/76846* (2013.01); *H01L 21/76802* (2013.01); *H01L 21/76862* (2013.01); *H01L 21/76877* (2013.01); *H01L 23/5226* (2013.01); *H01L 23/53238* (2013.01)

(58) Field of Classification Search
CPC ......... H01L 21/76846; H01L 21/76856; H01L 21/76847; H01L 21/76802; H01L 21/76877; H01L 2221/1073; H01L 21/02362; H01L 23/5226; H01L 23/53238; H01L 21/76864; H01L 21/76862
See application file for complete search history.

(56) References Cited

U.S. PATENT DOCUMENTS

| | | | | |
|---|---|---|---|---|
| 7,514,353 B2 * | 4/2009 | Weidman | ............... | B82Y 30/00 257/E21.575 |
| 9,966,339 B2 * | 5/2018 | Lin | ................... | H01L 23/53233 |
| 2009/0053426 A1 * | 2/2009 | Lu | ..................... | H01L 21/76864 427/540 |
| 2009/0289365 A1 * | 11/2009 | Yang | ................. | H01L 21/76846 438/653 |
| 2010/0301491 A1 * | 12/2010 | Yang | ................. | H01L 21/02063 438/653 |
| 2014/0191402 A1 * | 7/2014 | Lin | ................... | H01L 21/76802 257/751 |

(Continued)

*Primary Examiner* — Bac H Au
(74) *Attorney, Agent, or Firm* — FOLEY & LARNDER LLP

(57) ABSTRACT

A semiconductor device includes an interconnect structure embedded in a first metallization layer comprising a dielectric material. The interconnect structure includes a first metal material. The semiconductor device includes a first liner structure embedded in the first metallization layer. The first liner structure is extended along one or more boundaries of the interconnect structure in the first metallization layer. The first liner structure includes a second metal material reacted with one or more dopants, the second metal material being different from the first metal material.

20 Claims, 18 Drawing Sheets

(56) References Cited

U.S. PATENT DOCUMENTS

2015/0357236 A1\* 12/2015 Edelstein ............ H01L 23/5226
    438/653
2017/0117179 A1\* 4/2017 Koschinsky ...... H01L 23/53238

\* cited by examiner

SEMICONDUCTOR DEVICE INCLUDING LINER STRUCTURE

BACKGROUND

The present disclosure generally relates to semiconductor devices, and particularly to copper interconnect structures and methods for their fabrication.

Semiconductor devices are used in a variety of electronic applications, such as personal computers, cell phones, digital cameras, and other electronic equipment, as examples. As technology has progressed, the demand for smaller semiconductor devices with improved performance has increased. As feature densities increase, the widths of the conductive lines, and the spacing between the conductive lines of back-end of line (BEOL) interconnect structures also need to scale smaller.

A move is being made away from the traditional materials used in the past in semiconductor device designs, in order to meet these demands. For example, to reduce the RC time delay, there is a switch being made to the use of copper for interconnect materials, rather than aluminum. Advantages of using copper for semiconductor device interconnects include abilities to operate faster and manufacture thinner conductive lines because copper has lower resistivity and increased electromigration resistance compared to aluminum. Copper interconnects are often formed using damascene processes rather than by direct etching. Damascene processes are typically either single or dual damascene, which includes forming openings by patterning and etching inter-metal dielectric (IMD) layers and filling the openings with copper. Because copper diffuses easily into some dielectric materials, a diffusion barrier layer (e.g., formed of nitride compounds of refractory metals) is usually deposited on the inner walls of the damascene opening before the copper is formed. However, there are some challenges in using such barrier layers in the copper damascene structure such as, for example, reaching decent thermal stability, durable adhesion to the copper interconnect, etc.

Therefore, there is a need for an improved copper interconnect, and a method of forming thereof.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of illustration.

DETAILED DESCRIPTION OF EXEMPLARY EMBODIMENTS

Figure 1:
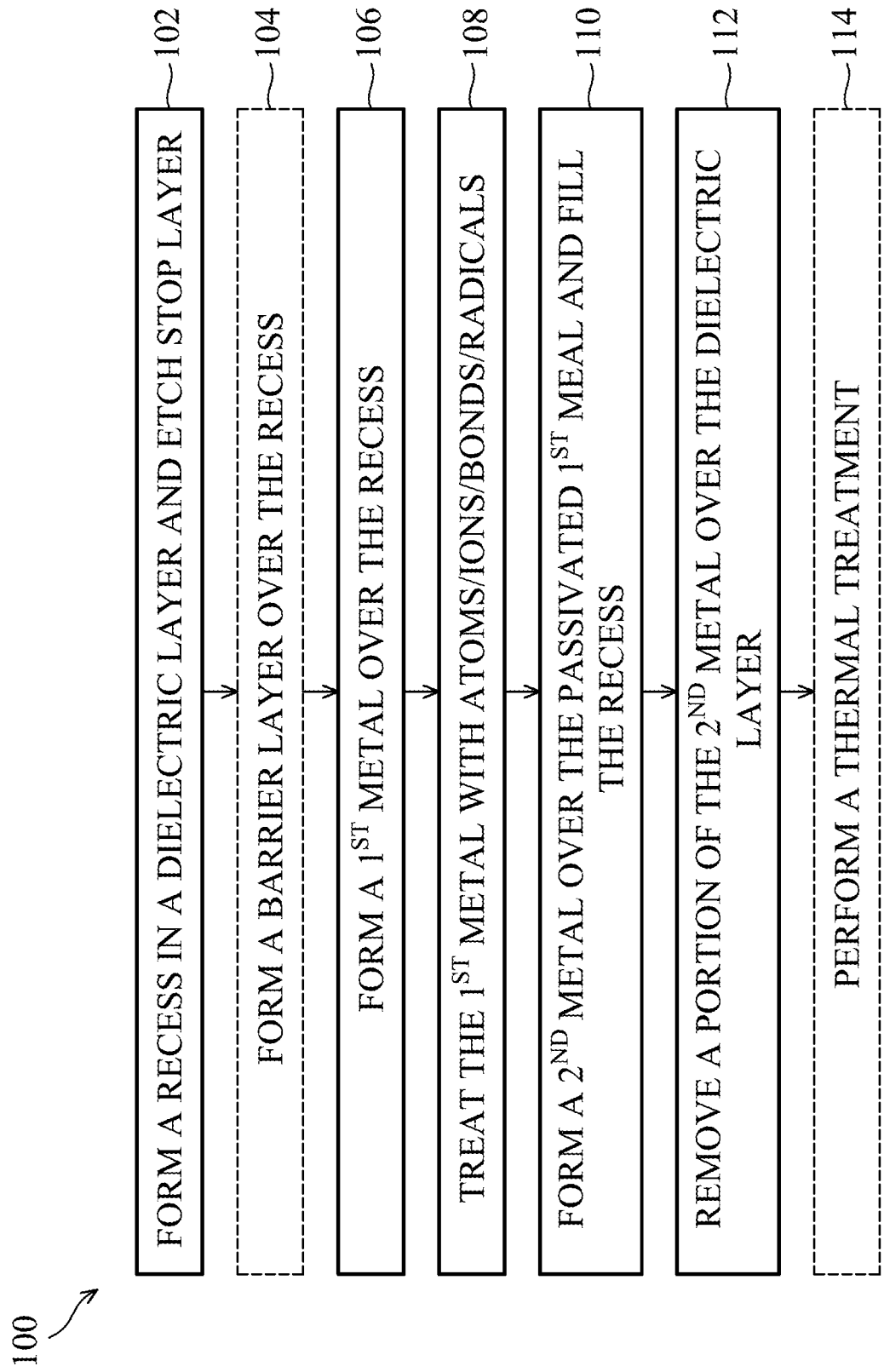
FIG. 1 illustrates a flow chart of an example method for forming a semiconductor device, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of an interconnect structure. The interconnect structure, which mainly includes copper, can be formed by a damascene process. The interconnect structure may be at least partially wrapped by one or more liner structures. In some embodiments, the liner structures may include a metal material, different from copper, that has been reacted with one or more ions, atoms, and/or radicals during (e.g., prior to) formation of the copper interconnect structure. In some embodiments, the liner structure may include an alloy of one or more metal materials, different from copper. Forming such a liner structure prior to the copper interconnect structure in a damascene process may eliminate the need for a barrier layer. Further, by at least partially wrapping the copper interconnect structure with the liner structure, adhesion of the copper interconnect structure to adjacent dielectric layers and thermal stability of the copper interconnect structure can be advantageously improved.

FIG. 1 is a flowchart illustrating a method 100 for fabricating a semiconductor device 200, according to various aspects of the present disclosure. FIGS. 2, 3, 4, 5, 6, 7, 8, 9, and 10 show schematic cross-sectional views of the semiconductor device 200 at various stages of fabrication according to an embodiment of the method 100 of FIG. 1. The semiconductor device 200 may be included in a microprocessor, memory cell, and/or other integrated circuit (IC). It is noted that the method of FIG. 1 does not produce a completed semiconductor device 200. A completed semiconductor device 200 may be fabricated using complementary metal-oxide-semiconductor (CMOS) technology processing. Accordingly, it is understood that additional processes may be provided before, during, and after the method 100 of FIG. 1, and that some other processes may only be briefly described herein. Also, FIGS. 1 through 10 are simplified for a better understanding of the present disclosure. For example, although the figures illustrate the semiconductor device 200, it is understood the IC may comprise a number of other devices comprising transistors, resistors, capacitors, inductors, fuses, etc.

Figure 2:
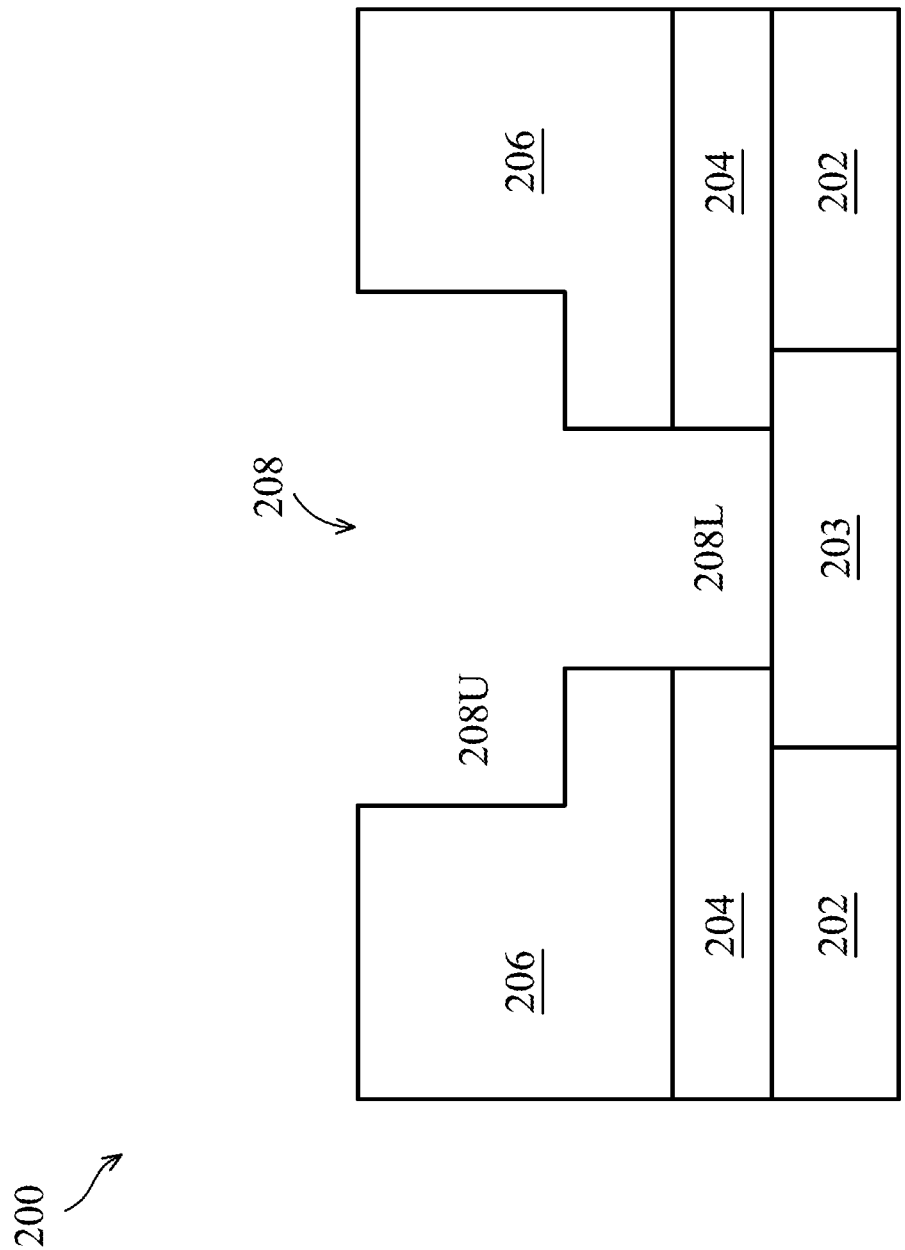
FIGS. 2, 3, 4, 5, 6, 7, 8, 9, and 10 illustrate cross-sectional views of an example semiconductor device during various fabrication stages, made by the method of FIG. 1, in accordance with some embodiments.

Referring to FIGS. 1 and 2, the method 100 begins at step 102 in which a recess (or cavity) 208 is formed in an etch stop layer 204 and a dielectric layer (or dielectric material) 206. In some embodiments, the etch stop layer 204 and the dielectric layer 206 can form a portion of an inter-metal dielectric (IMD) layer. Such an IMD layer is sometimes referred to as a metallization layer that includes one or more interconnect structures embedded within a corresponding dielectric layer or material. The interconnect structures can be formed of at least one metal material, such as copper (Cu), which will be discussed below. In some embodiments, the etch stop layer 204 is formed over a semiconductor substrate 202 and under the dielectric layer 206. In some embodiments, the recess 208 is formed in the dielectric layer 206 and the etch stop layer 204, for example, at least partially extending through the dielectric layer 206 and the etch stop layer 204.

The semiconductor substrate 202 is a substrate as employed in a semiconductor integrated circuit fabrication, and integrated circuits may be formed therein and/or thereupon. The term "semiconductor substrate" as used herein refers to as any construction comprising semiconductor material, for example, a silicon substrate with or without an epitaxial layer, a silicon-on-insulator substrate containing a buried insulator layer, or a substrate with a silicon germanium layer. The term "integrated circuits" as used herein refers to electronic circuits having multiple individual circuit elements, such as transistors, diodes, resistors, capacitors, inductors, and other active and passive semiconductor devices. As shown, a conductive region 203 may be formed in and/or on the semiconductor substrate 202 (e.g., in the semiconductor substrate 202 exposed by the recess 208). The conductive region 203 may be a portion of conductive routes and has exposed surfaces that may be treated by a planarization process, such as chemical mechanical polishing. Suitable materials for the conductive region 203 may include, but not limited to, for example copper, aluminum, copper alloy, or other mobile conductive materials. The semiconductor substrate 202 containing such a copper conductive region 203 may be the first or any subsequent metallization layers (or metallization levels) of the semiconductor device 200.

The etch stop layer 204 functions for controlling the end point during subsequent etching processes. In some embodiments, the etch stop layer 204 is formed of silicon oxide, silicon nitride, silicon carbide, silicon oxynitride or combinations thereof. In some embodiments, the etch stop layer 204 has a thickness of about 10 angstroms to about 1000 angstroms. The etch stop layer 204 is formed through any of a variety of deposition techniques, including, LPCVD (low-pressure chemical vapor deposition), APCVD (atmospheric-pressure chemical vapor deposition), PECVD (plasma-enhanced chemical vapor deposition), PVD (physical vapor deposition), sputtering, and future-developed deposition procedures.

The dielectric layer 206 may be a single layer or a multi-layered structure. In some embodiments, the dielectric layer 206 with a thickness varies with the applied technology, for example a thickness of about 1000 angstroms to about 30000 angstroms. In some embodiments, the dielectric layer 206 is silicon oxide, carbon-doped silicon oxide, a comparatively low dielectric constant (k value) dielectric material with a k value less than about 4.0, or combinations thereof. In some embodiments, the dielectric layer 206 is formed of a material, including low-k dielectric material, extreme low-k dielectric material, porous low-k dielectric material, and combinations thereof. The term "low-k" is intended to define a dielectric constant of a dielectric material of 3.0 or less. The term "extreme low-k (ELK)" means a dielectric constant of 2.5 or less, and preferably between 1.9 and 2.5. The term "porous low-k" refers to a dielectric constant of a dielectric material of 2.0 or less, and preferably 1.5 or less. A wide variety of low-k materials may be employed in accordance with embodiments, for example, spin-on inorganic dielectrics, spin-on organic dielectrics, porous dielectric materials, organic polymer, organic silica glass, FSG (SiOF series material), HSQ (hydrogen silsesquioxane) series material, MSQ (methyl silsesquioxane) series material, or porous organic series material. In some embodiments, the dielectric layer 206 is deposited through any of a variety of techniques, such as chemical vapor deposition (CVD), physical vapor deposition (PVD), atomic layer deposition (ALD), remote plasma enhanced chemical vapor deposition (RPECVD), liquid source misted chemical deposition (LSMCD), coating, spin-coating or another process that is adapted to form a thin film layer over the substrate.

In embodiments, the dielectric layer 206 is a nitrogen-containing layer, a carbon-containing layer, or a carbon-containing and nitrogen-containing layer for increasing corrosion resistance during a subsequent chemical mechanical polishing (CMP) process and/or increasing electromigration resistance. In one embodiment, the dielectric layer 206 is a silicon-containing and nitrogen-containing dielectric layer. In another embodiment, the dielectric layer 206 is a silicon-containing and carbon-containing dielectric layer. In yet another embodiment, the dielectric layer 206 is a silicon-containing, nitrogen-containing, and carbon-containing dielectric layer. In one embodiment, the dielectric layer 206 has a ratio by weight of carbon to silicon about equal or greater than 0.5. In another embodiment, the dielectric layer 206 has a ratio by weight of nitrogen to silicon about equal or greater than 0.3. In yet another embodiment, the dielectric layer 206 has a ratio by weight of carbon to silicon about equal or greater than 0.5 and a ratio by weight of nitrogen to silicon about equal or greater than 0.3.

The recess 208 is an example dual damascene opening including an upper trench section 208U and a lower via-hole section 208L. The recess 208 is patterned in the dielectric layer 206 and the etch stop layer 204 to define a contact region on the semiconductor substrate 202. Although the embodiments illustrate dual damascene openings in the IMD layer, the use of single damascene openings in the IMD layer also provide values. In dual damascene techniques including a "via-first" patterning method or a "trench-first" patterning method, the upper trench section 208U and the lower via-hole section 208L may be formed using a typical lithographic with masking technologies and anisotropic etch operation (e.g. plasma etching or reactive ion etching). In alternative embodiments, a bottom etch stop layer (not shown), a middle etch stop layer (not shown), a polish stop layer (not shown), or an anti-reflective coating (ARC) layer (not shown) is deposited on or intermediately in the dielectric layer 206, providing a clear indicator of when to end a particular etching process.

Figure 3:
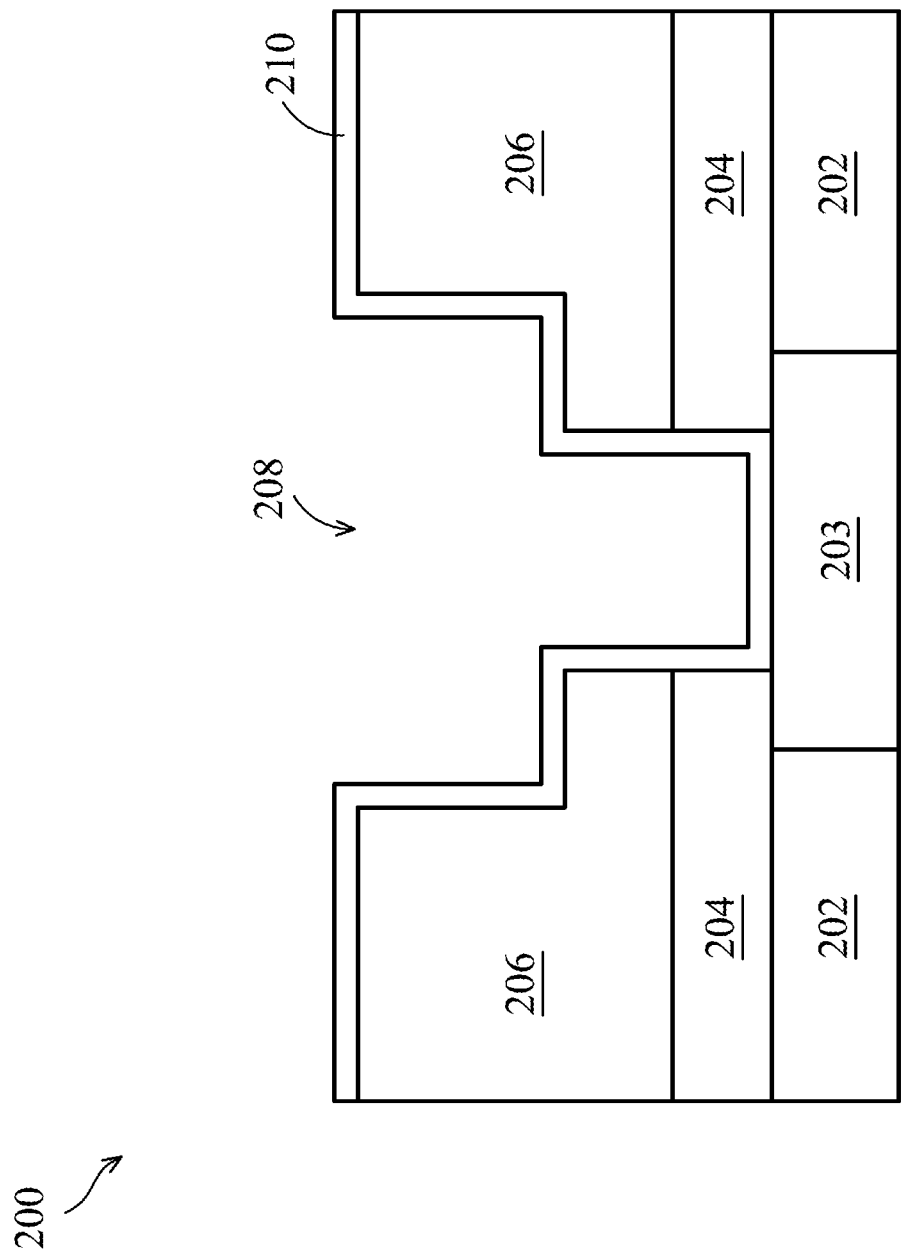

Referring to FIGS. 1 and 3, the method 100 proceeds to step 104 in which a barrier layer 210 is formed on the above-described structure to line the sidewalls and bottoms of the recess 208 and over the dielectric layer 206. In some embodiments, the barrier layer 210 may be optional. The barrier layer 210 may function as a barrier to prevent a subsequently formed conductor from diffusing into the underlying dielectric layer 206. In some embodiments, the barrier layer 210 includes a metal material such as, for example, tantalum (Ta), titanium (Ti), tungsten (W), and titanium (Ti). In some embodiments, the barrier layer 210 includes a compound or an alloy of the above-identified metal materials such as, for example, tantalum nitride (TaN), tantalum nitride silicon (TaNSi), titanium tungsten (TiW), and titanium nitride silicon (TiNSi). In some embodiments, the barrier layer 210 has a thickness of about 10 angstrom to about 250 angstroms.

Figure 4:
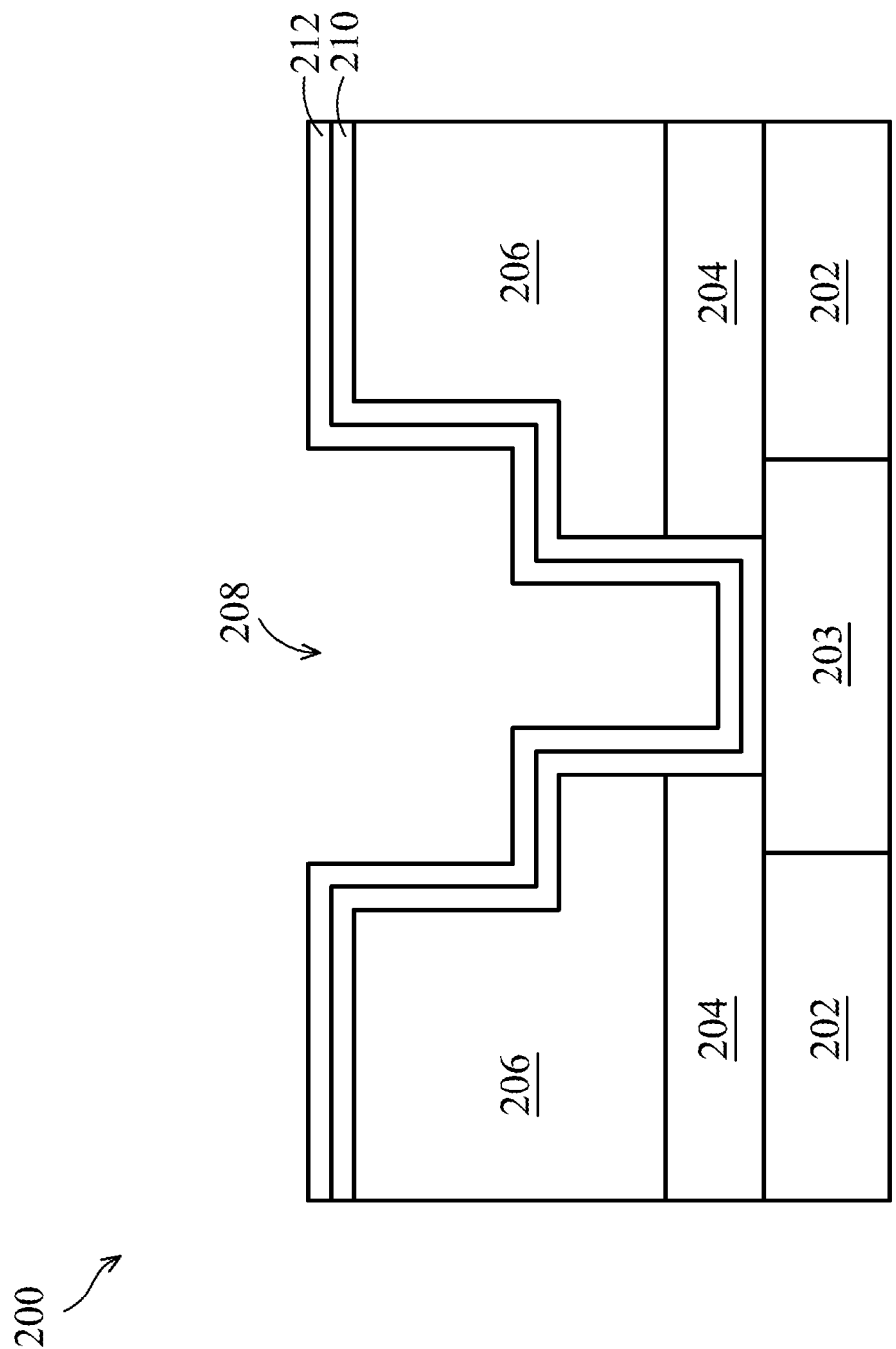

Referring to FIGS. 1 and 4, the method 100 proceeds to step 106 in which a first metal material 212 is formed on the above-described structure to line the sidewalls and bottoms of the recess 208 and over the barrier layer 210 (if formed). As the optional barrier layer 210 is not formed, the first metal material 212 may be in direct contact with the sidewalls and bottoms of the recess 208 and over the dielectric layer 206. The first metal material 212 includes at least one material selected from the group consisting of: cobalt (Co), ruthenium (Ru), tantalum (Ta), titanium (Ti), tungsten (W), molybdenum (Mo), zinc (Zn), aluminum (Al), and manganese (Mn). In some embodiments, the first metal material 212 has a thickness of about 1 angstrom to about 150 angstroms. In some embodiments, the first metal material 212 has a thickness ranging from about 5 angstroms to about 50 angstroms. In some embodiments, the first metal material 212 is deposited by using physical vapor deposition (PVD), chemical vapor deposition (CVD), plasma enhanced CVD (PECVD), low pressure CVD (LPCVD), atomic layer deposition (ALD), or other well-known deposition techniques.

Figure 5:
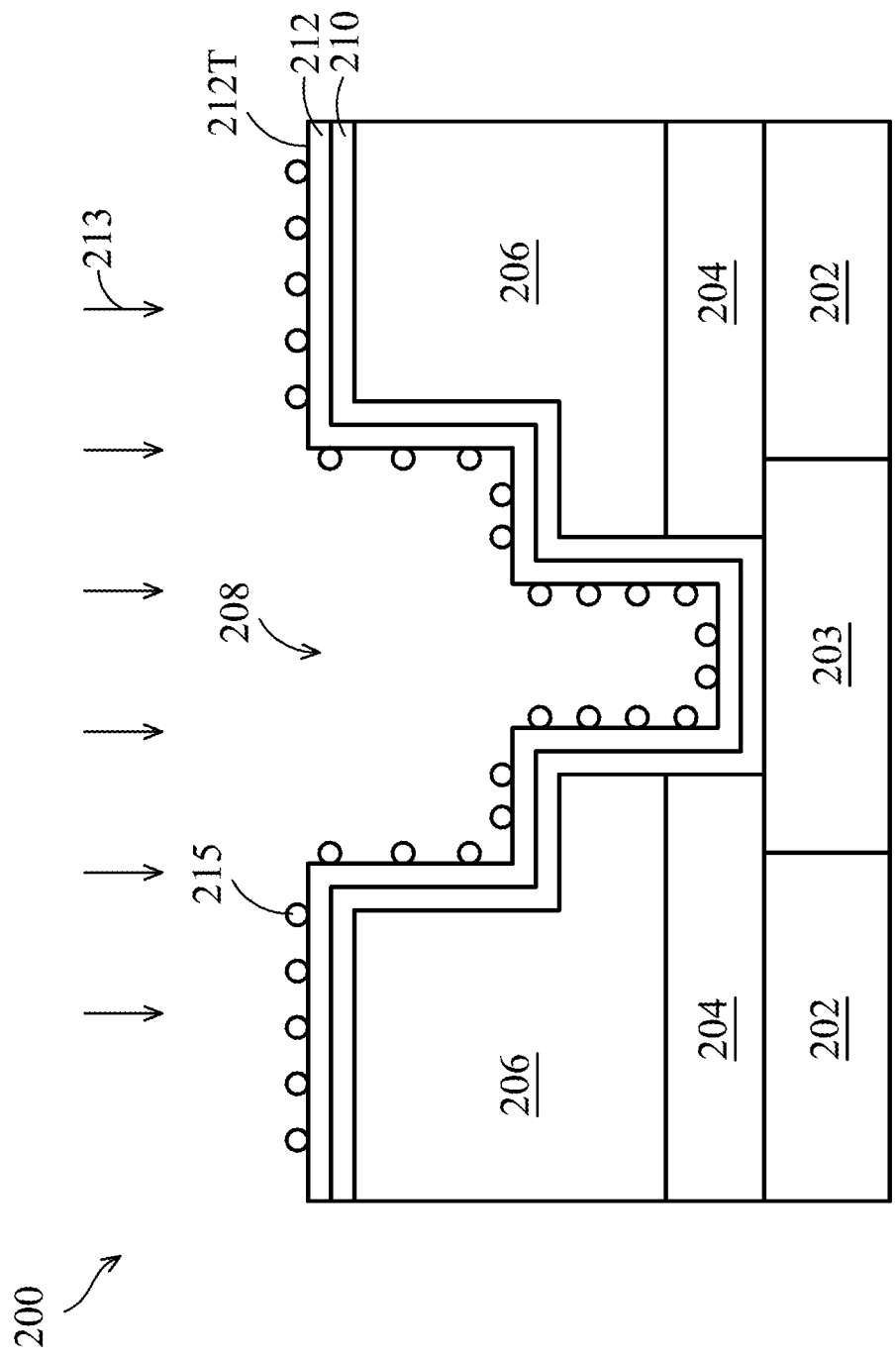

Referring to FIGS. 1 and 5, the method 100 proceeds to step 108 in which a treatment process 213 is performed on the first metal material 212. In some embodiments, the treatment process 213 can be configured to treat, passivate, dope, or otherwise modify a top boundary 212T of the first metal material 212 with one or more atoms, ions, and/or radicals 215 (hereinafter "dopants 215"). In some embodiments, the dopants 215 can include one or more of reactive hydrogen atoms/ions/radicals, reactive hydroxide ions/radicals, reactive nitrogen atoms/ions/radicals, and reactive carbon-hydrogen ions/radicals. The dopants 215 may react with (e.g., bond to) atoms of the metal material 212 (e.g., the atoms with dangling bonds). In some embodiments, upon reacting with the atoms of the metal material 212, the dopants 215 and a portion of the atoms of the metal material 212 (e.g., the portion of the atoms exposed on the top boundary 212T and/or substantially close to the top boundary 212T) may form a doped liner structure. The doped liner structure may be formed along the top boundary 212T of the metal material 212, which lines the sidewalls and bottoms of the recess 208 and over the barrier layer 210 (or the dielectric layer 206). Alternatively or additionally, based on a reaction time, an operating temperature, an operating pressure, an applied energy, a flow rate of reactant gases, and/or any of other suitable operating parameters of the treatment process 213, substantially almost all the atoms of the metal material 212 may react with the dopants 215.

For example, the treatment process 213 can include a hydrogen ($H_2$) plasma process, used to supply hydrogen for the bonds between the metal material 212 and hydrogen, by flowing hydrogen gas or precursor into a vacuum (airtight) chamber. The chamber may be maintained at a temperature not greater than 400° C. and at a pressure ranging from as high as about 760 Torr (ambient pressure) to as low about 0.01 milliTorr, with the gas flow adjusted according to both the desired pressure, as well as the size of the treatment chamber. For example, in a five liter volume chamber, the flow of hydrogen gas may vary from as little as 1 standard cubic centimeters per minute (sccm) for low pressure conditions to as high as 200 sccm for ambient pressure operating conditions. For other size chamber, flow ranges equivalent to such flow rates for a five liter chamber can be derived from these ranges. A non-reactive gas such as, for example, helium, neon, or argon may also be flowed into the chamber with the hydrogen gas, particularly at higher operating pressures. Any power supply capable of igniting and maintaining the hydrogen plasma in the chamber may be utilized. The power supply can be operated in any suitable form such as, for example, direct current (DC), radio frequency (RF), pulsed DC, mid frequency (MF), and high-power impulse magnetron sputtering (HIPIMS). Typically, for a five liter chamber, the plasma generating power supply may vary from about 30 to about 1500 watts. For other chamber sizes, the plasma power requirements will be scaled up or down accordingly, as with the previously mentioned flow rates, and the actual power ranges needed for such chambers will be equivalent to the above recited ranges for a five liter chamber. An optional bias of from 0 to about 300 volts may be applied to the device 200 (e.g., the substrate 202).

In another example, the treatment process 213 can include a nitrogen ($N_2$) plasma process, used to supply nitrogen for the bonds between the metal material 212 and nitrogen, by flowing nitrogen gas or precursor into a vacuum (airtight) chamber, with similar operating parameters as described above. In yet another example, the treatment process 213 can include an ammonia ($NH_3$) plasma process, used to supply nitrogen and/or hydrogen for the bonds between the metal material 212 and nitrogen and/or hydrogen, by flowing nitrogen gas or precursor into a vacuum (airtight) chamber, with similar operating parameters as described above. In yet another example, the treatment process 213 can include a methanol (MeOH) plasma treatment, used to supply hydroxide bonds and/or methyl group bonds for reacting with the metal material 212, by flowing methanol gas or precursor into a vacuum (airtight) chamber, with similar operating parameters as described above. In yet another example, the treatment process 213 may include a soaking process, used to soak the metal material 212, by flowing corresponding gas or precursor into a vacuum (airtight) chamber, without forming plasma.

Figure 6:
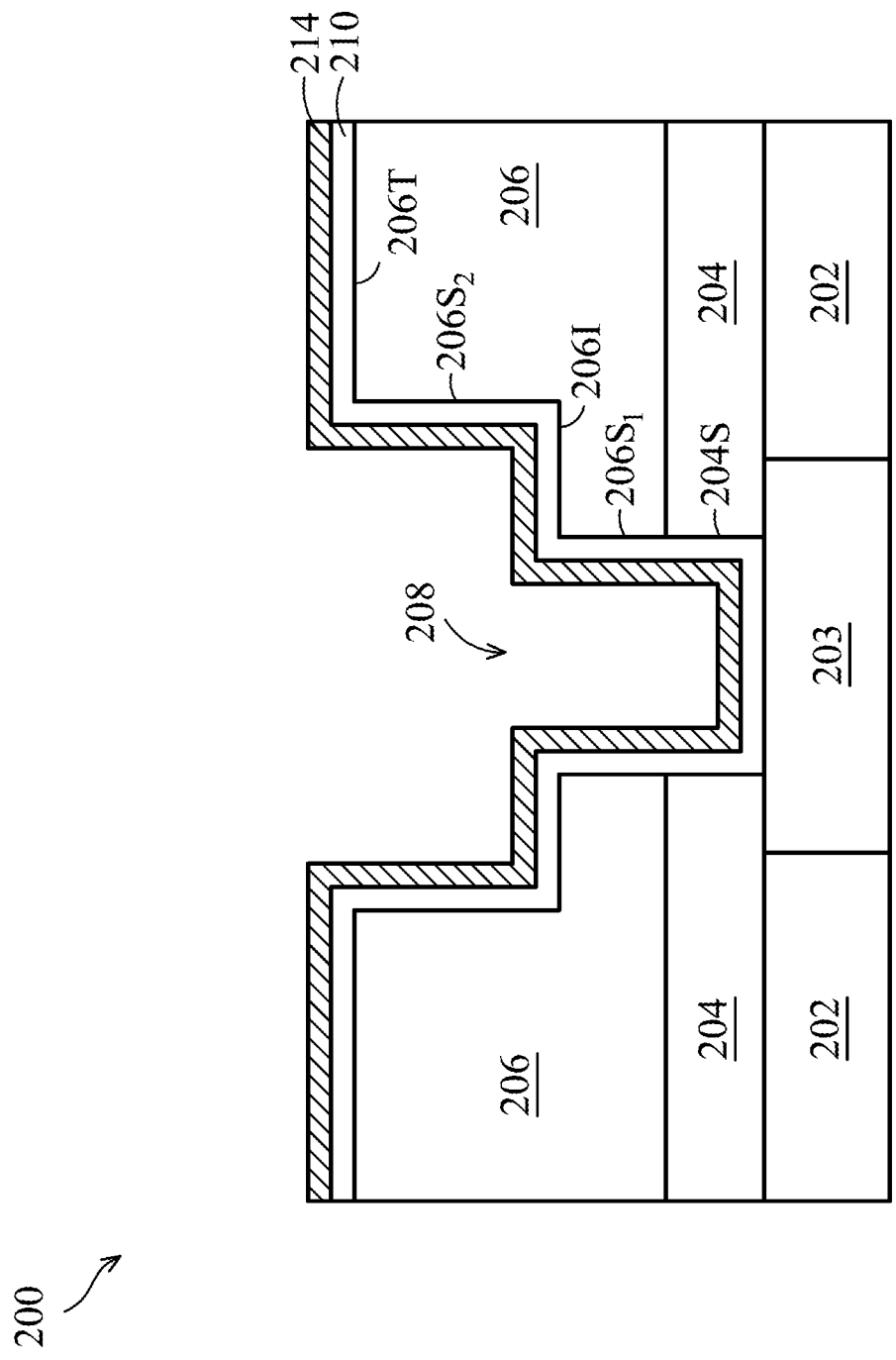

In the embodiments where substantially almost all the atoms of the metal material 212 react with (e.g., bonded by) the dopants 215, the metal material 212 may be converted or transformed into a doped liner structure 214, as shown in FIG. 6. The doped liner structure 214 may line the sidewalls and bottoms of the recess 208 and over the dielectric layer 206, when the optional barrier layer 210 is not formed. Specifically, the doped liner structure 214 may be in direct contact with one or more inner surfaces/boundaries of the dielectric layer 206 and the etch stop layer 204. For example, the doped liner structure 214 can be in direct contact with inner sidewalls $206S_1$ and $206S_2$ of the dielectric layer 206, intermediate boundary 206I of the dielectric layer 206, and inner sidewalls 204S of the etch stop layer 204. Further, the doped liner structure 214 can also be in direct contact with top boundary 206T of the dielectric layer 206.

In the example where the metal material 212 includes Co, the doped liner structure 214 can include Co nitride (e.g., $CoN_x$, CoN, $Co_3N$, $Co_4N$), Co hydride (e.g., $CoH_x$, CoH, $CoH_2$, $CoH_3$), Co carbide (e.g., $CoC_x$, CoC, $Co_2C$, $Co_3C$), etc., in accordance with which of the gases or precursors are used in the plasma process 213. In the example where the metal material 212 includes Ru, the doped liner structure 214 can include Ru nitride (e.g., $RuN_x$, $Ru_4N$, $Ru_3N$, $Ru_2N$, RuN, $RuN_2$), Ru Carbide (e.g., $RuC_x$, RuC), Ru—C—N, Ru hydride complex, etc., in accordance with which of the gases or precursors are used in the plasma process 213. In the example where the metal material 212 includes Ta, the doped liner structure 214 can include Ta nitride (e.g., $TaN_x$, TaN, $Ta_2N$, $Ta_3N_5$, $Ta_4N_5$, $Ta_5N_6$), Ta carbide (e.g., $TaC_x$, TaC, $Ta_4C_3$, $Ta_2C$), Ta hydride ($TaH_x$, $TaH_2$, $TaH_3$), etc., in accordance with which of the gases or precursors are used in the plasma process 213.

Although the doped liner structure 214 is shown as a single layer in FIG. 6 (and the following figures), it is understood that the doped liner structure 214 can be formed as a multi-layer stack while remaining within the scope of the present disclosure. For example, the doped liner structure 214 can include a plurality of layers, a first one of which includes a metal material similar as the metal material 212, without or with a substantially limited amount of dopants 215 (e.g., Co), and a second of which includes metal material similar as the metal material 212, reacted with a certain amount of dopants 215 (e.g., $CoN_x$).

Figure 7:
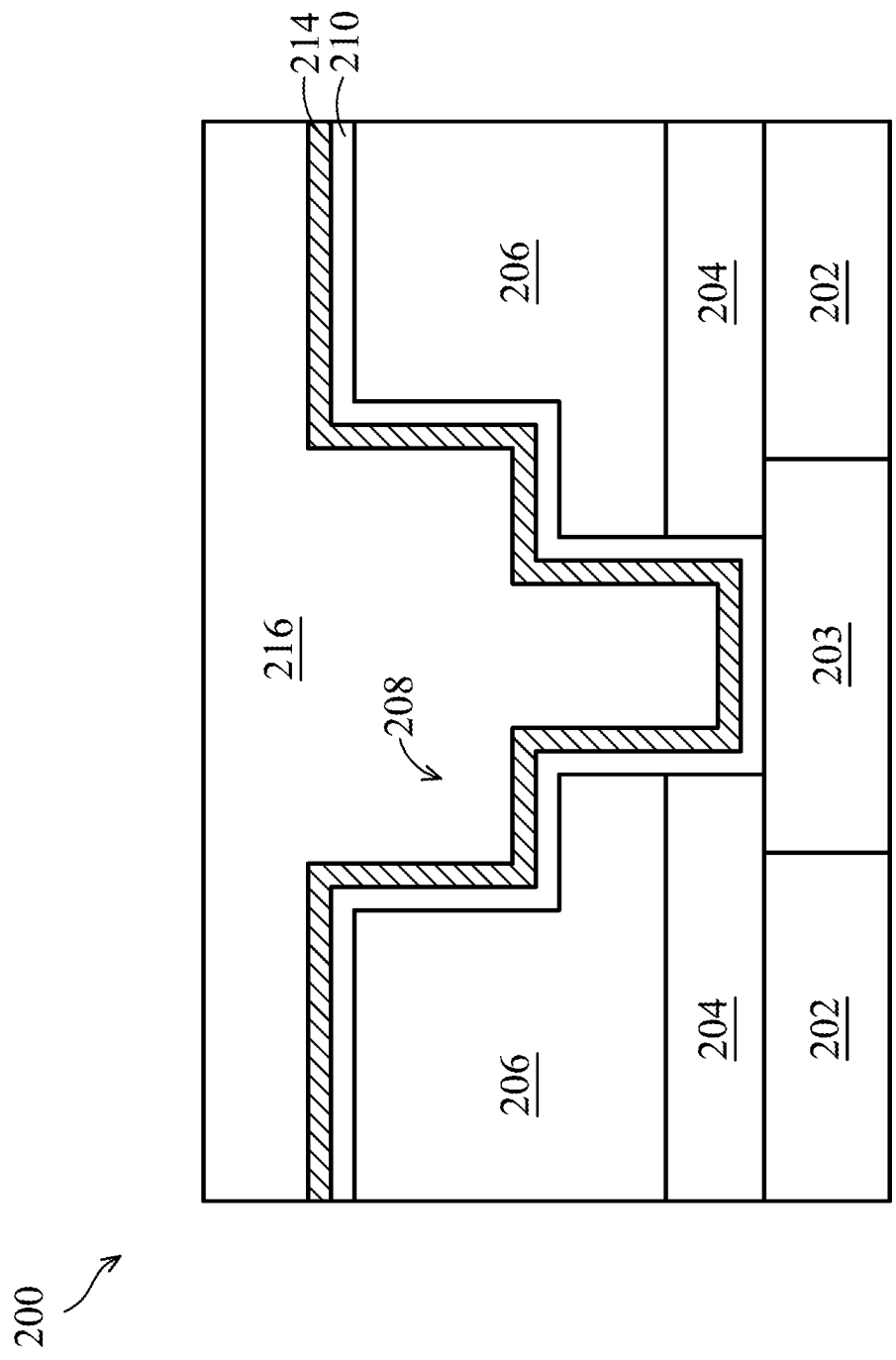

Referring to FIGS. 1 and 7, the method 100 proceeds to step 110 in which a second metal material 216 is formed over the doped liner structure 214 to fill the recess 208. In some embodiments, the second metal material 216 is formed as an interconnect structure in the dielectric layer 206. In some embodiments, the second metal material 216 is deposited by an electro-chemical plating (ECP) process, physical vapor deposition (PVD), chemical vapor deposition (CVD), plasma enhanced CVD (PECVD), low pressure CVD (LPCVD), atomic layer deposition (ALD), or other well-known deposition techniques. In some embodiments, the second metal material 216 at least contains a main metal element, e.g., copper (Cu). In some embodiments, the second metal material 216 further contains an additive metal element. In some embodiments, the additive metal element in the second metal material 216 is tantalum (Ta), indium (In), tin (Sn), zinc (Zn), manganese (Mn), chromium (Cr), titanium (Ti), germanium (Ge), strontium (Sr), platinum (Pt), magnesium (Mg), aluminum (Al), or zirconium (Zr).

Figure 8:
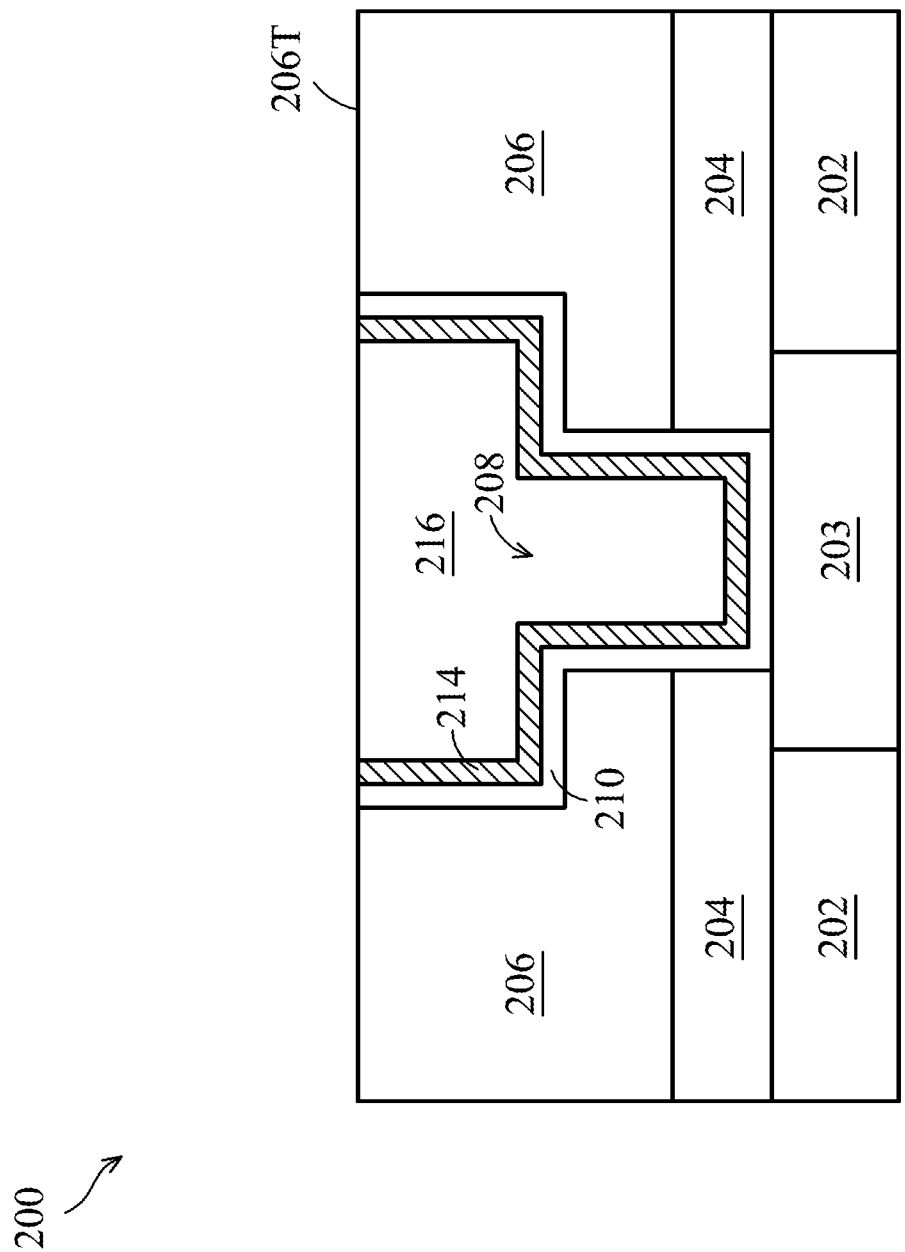

Referring to FIGS. 1 and 8, the method 100 proceeds to step 112 in which a portion of the second metal material 216 over the dielectric layer 206 is removed. In some embodiments, the removing process is chemical mechanical polishing (CMP) process performed to remove the excess portions of the second metal material 216, the doped liner structure 214, and the optional barrier layer 210 outside the recess 208, thus exposing the top boundary 206T of the dielectric layer 206 and achieving a planarized surface.

Figure 9:
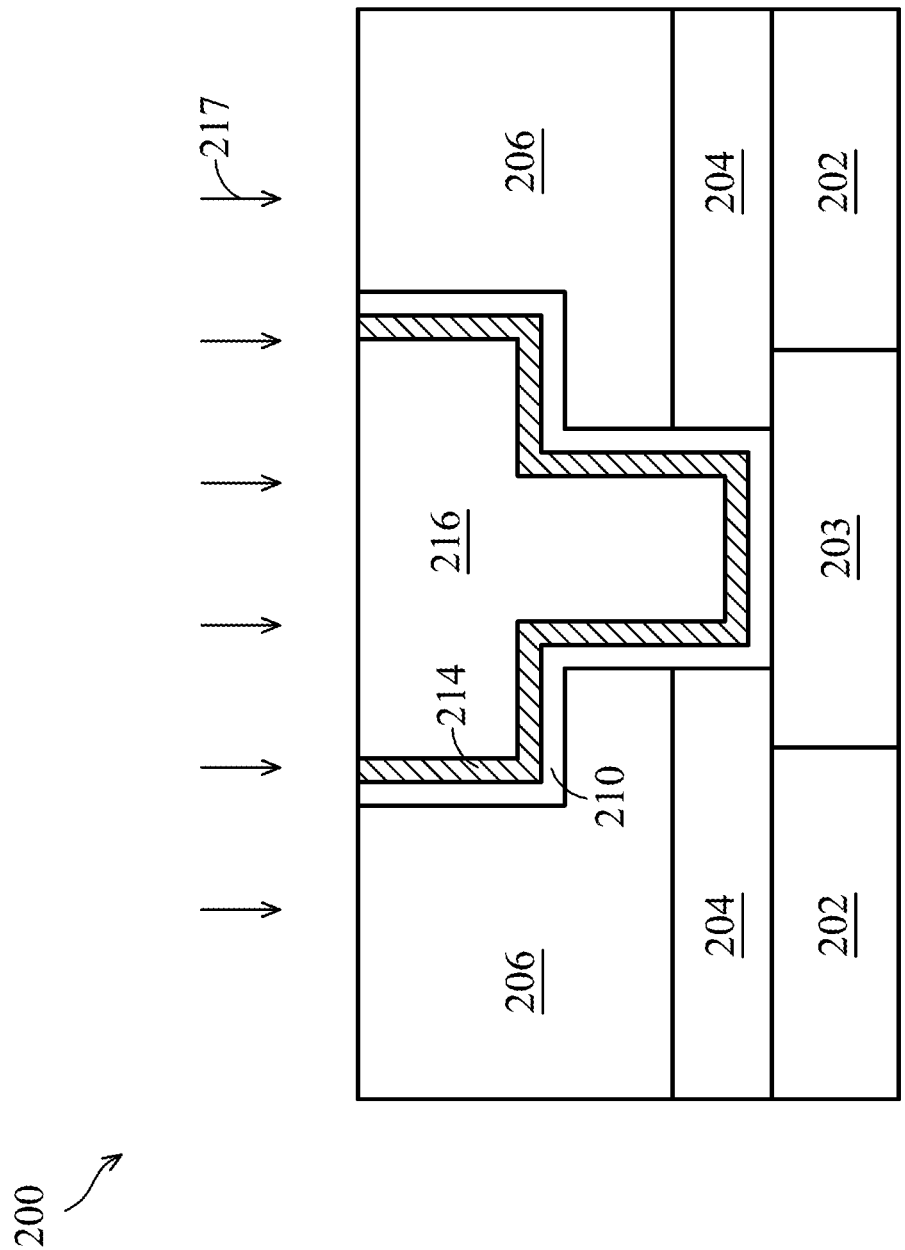

Referring to FIGS. 1 and 9, the method 100 proceeds to step 114 in which a thermal treatment 217 is optionally performed on the semiconductor device 200. In some embodiments, the thermal treatment 217 includes an annealing process. In one embodiment, the thermal treatment 217 is performed at a temperature ranged from about 137° C. to about 600° C. In another embodiment, the thermal treatment 217 is performed at a temperature ranged from about 280° C. to about 400° C. In one embodiment, the thermal treatment 217 is performed at a duration ranged from about 10 minutes to about 600 minutes. In some embodiments, the thermal treatment 217 is performed using furnace, rapid thermal processing (RTP), or hot plate equipment. The thermal treatment 217 can be provided by any thermal processing after performing the plasma process 213 (FIG. 5). In various alternative embodiments, the thermal treatment 217 is provided at the time immediately after the plasma process 213, immediately after the CMP to remove the excess portions of the second metal material 216 outside the recess 208, or immediately after forming a passivation layer on a top metal layer.

Figure 10:
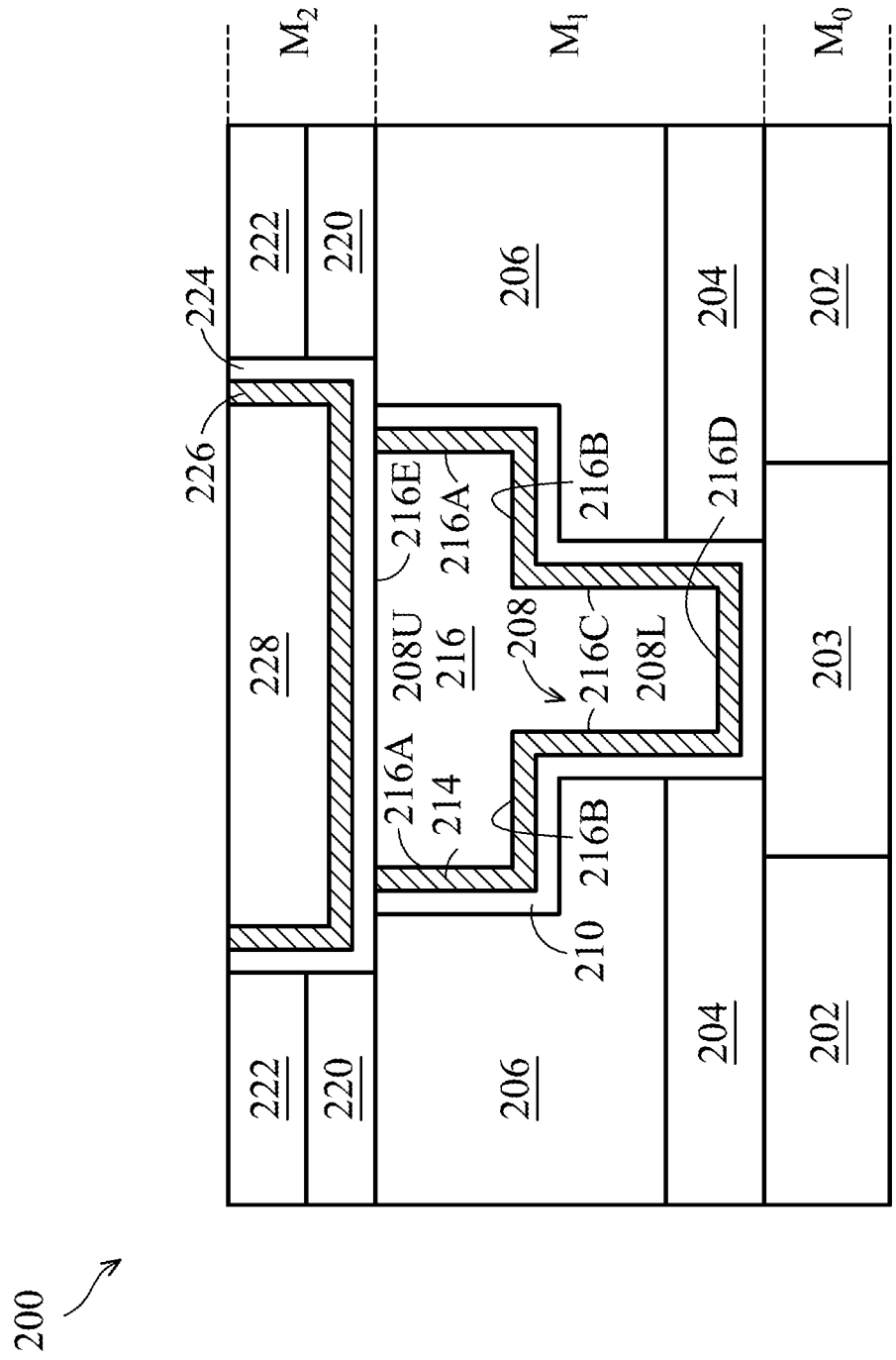

It is noted that the method 100 may be iteratively performed to form one or more subsequent metallization layers of the semiconductor device 200. For example, by repeating the steps 102-114, the semiconductor device 200 can include another etch stop layer 220, another dielectric layer 222, another optional barrier layer 224, another doped liner structure 226, and another metal material 228, as shown in FIG. 10. The etch stop layer 220, dielectric layer 222, optional barrier layer 224, doped liner structure 226, and metal material 228 are substantially similar to the etch stop layer 204, dielectric layer 206, barrier layer 210, doped liner structure 214, and the metal material 216. Thus, the discussions shall not be repeated.

In some embodiments, the conductive feature 203 may be disposed (or embedded) in a first metallization layer (e.g., indicated as M0 in FIG. 10) and the metal material 228, formed as another conductive feature, may be disposed (or embedded) in a second metallization layer (e.g., indicated as M2 in FIG. 10). As such, the second metal material 216 may be disposed (or embedded) in a third metallization layer (e.g., indicated as M1 in FIG. 10) between the first metallization layer and the second metallization layer. In some embodiments, the second metal material 216, which is at least partially wrapped by the doped liner structures 214 and 226, is configured as interconnect structure to electrically connect the conductive feature 203 to the conductive feature 228. Thus, the second metal material 216 may herein be referred to as "interconnect structure 216." As the interconnect structure 216 fills the recess 208 having the upper trench portion 208U and the lower via-hole portion 208L, the interconnect structure 216 can inherit the shape of the recess 208 to include a trench portion filling the upper trench portion 208U and a via portion filling the lower via-hole portion 208L. The trench portion and the via portion of the interconnect structure 216 are in direct contact with each other to form an integral piece, in some embodiments.

In some embodiments, the doped liner structure 214 is extended along some of the boundaries of the interconnect structure 216 that is embedded in (or not exposed by) the metallization layer M1, which includes the dielectric layer 206 and the etch stop layer 204. For example in FIG. 10, the doped liner structure 214 is extended along the boundaries 216A, 216B, 216C, and 216D in the metallization layer M1. Similarly, the doped liner structure 226, in the next higher metallization layer M2, is extended along some of the boundaries of the interconnect structure 228 embedded in the metallization layer M2. Further, the doper liner structure 226 may also be extended along a boundary of the interconnect structure 216 exposed by the metallization layer M1. For example, the doper liner structure 226 is extended along a boundary 216E of the interconnect structure 216 that is exposed by the metallization layer M1.

Figure 11:
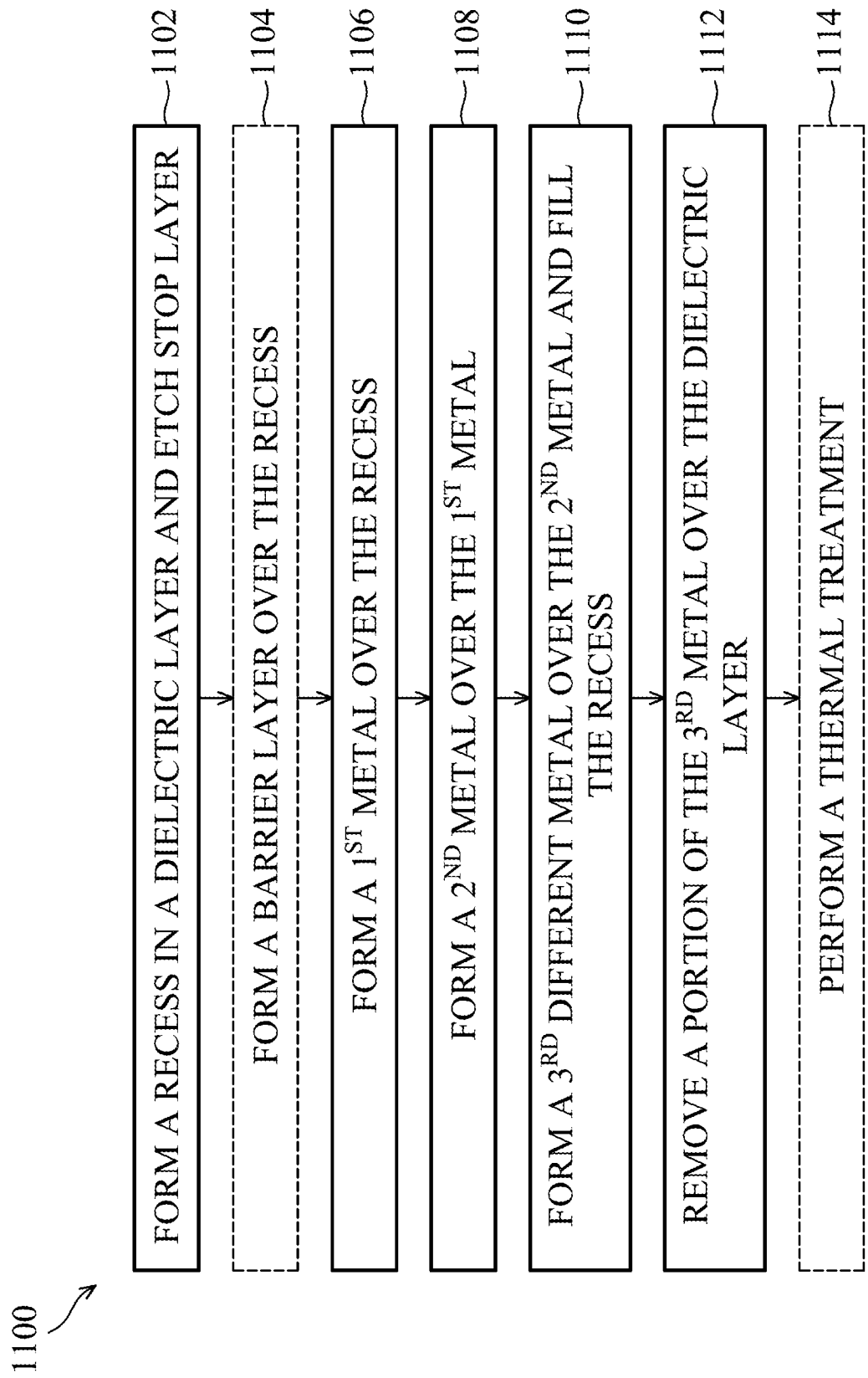
FIG. 11 illustrates a flow chart of an example method for forming a semiconductor device, in accordance with some embodiments.

FIG. 11 is a flowchart illustrating a method 1100 for fabricating a semiconductor device 300, according to various aspects of the present disclosure. FIGS. 12, 13, 14, 15, 16, 17, and 18 show schematic cross-sectional views of the semiconductor device 300 at various stages of fabrication according to an embodiment of the method 1100 of FIG. 11. The semiconductor device 300 may be included in a microprocessor, memory cell, and/or other integrated circuit (IC). It is noted that the method of FIG. 11 does not produce a completed semiconductor device 300. A completed semiconductor device 300 may be fabricated using complementary metal-oxide-semiconductor (CMOS) technology processing. Accordingly, it is understood that additional processes may be provided before, during, and after the method 1100 of FIG. 11, and that some other processes may only be briefly described herein. Also, FIGS. 12 through 18 are simplified for a better understanding of the present disclosure. For example, although the figures illustrate the semiconductor device 300, it is understood the IC may comprise a number of other devices comprising transistors, resistors, capacitors, inductors, fuses, etc.

Figure 12:
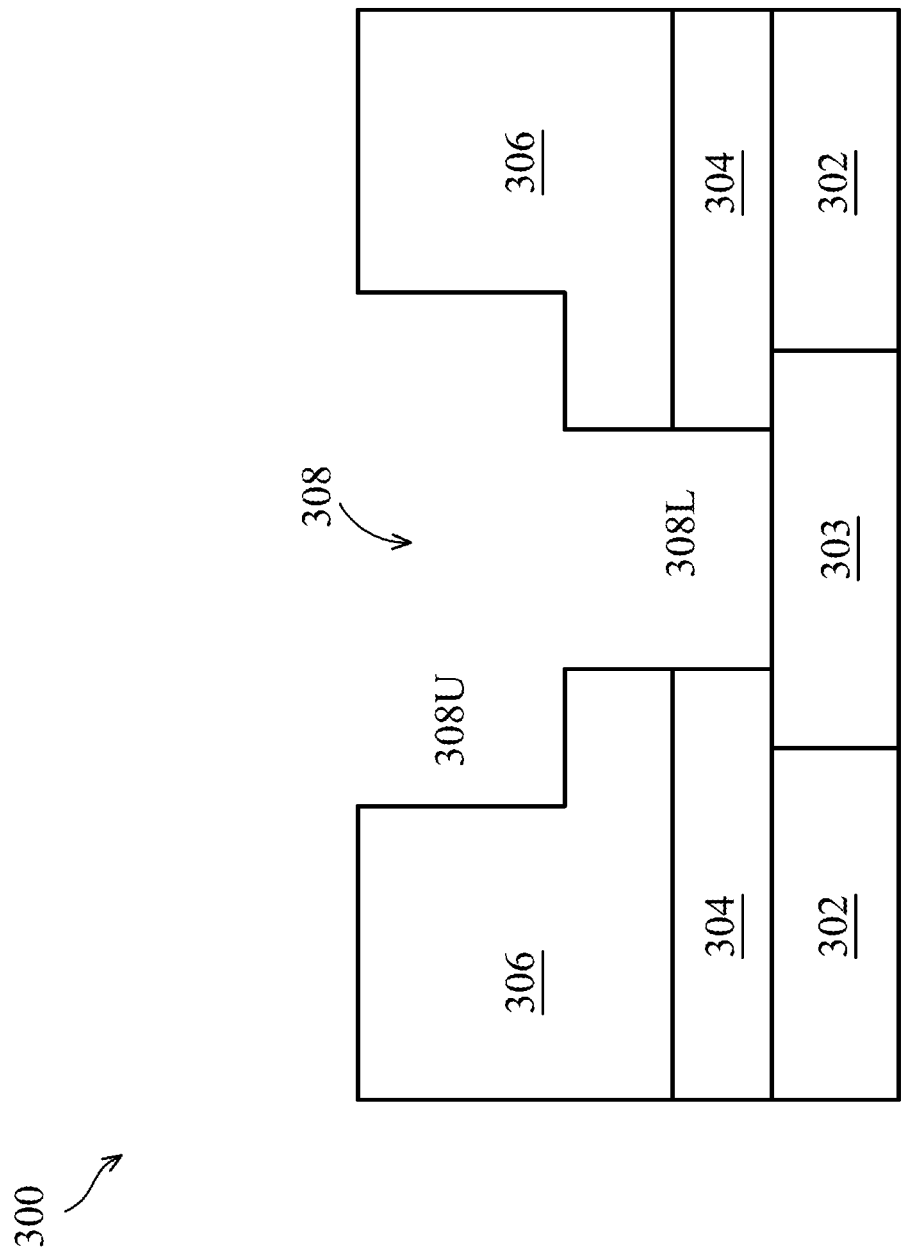
FIGS. 12, 13, 14, 15, 16, 17, and 18 illustrate cross-sectional views of an example semiconductor device during various fabrication stages, made by the method of FIG. 11, in accordance with some embodiments.

Referring to FIGS. 11 and 12, the method 1100 begins at step 1102 in which a recess 308 is formed in an etch stop layer 304 and a dielectric layer (or dielectric material) 306. In some embodiments, the etch stop layer 304 and the dielectric layer 306 can form a portion of an inter-metal dielectric (IMD) layer. Such an IMD layer is sometimes referred to as a metallization layer that includes one or more interconnect structures embedded within a corresponding dielectric layer or material. The interconnect structures can be formed of at least one metal material, such as copper (Cu), which will be discussed below. In some embodiments, the etch stop layer 304 is formed over a semiconductor substrate 302 and under the dielectric layer 306. In some embodiments, the recess 308 is formed in the dielectric layer 306 and the etch stop layer 304, for example, at least partially extending through the dielectric layer 306 and the etch stop layer 304.

The semiconductor substrate 302 is a substrate as employed in a semiconductor integrated circuit fabrication, and integrated circuits may be formed therein and/or thereupon. The term "semiconductor substrate" as used herein refers to as any construction comprising semiconductor material, for example, a silicon substrate with or without an epitaxial layer, a silicon-on-insulator substrate containing a buried insulator layer, or a substrate with a silicon germanium layer. The term "integrated circuits" as used herein refers to electronic circuits having multiple individual circuit elements, such as transistors, diodes, resistors, capacitors, inductors, and other active and passive semiconductor devices. As shown, a conductive region 303 may be formed in and/or on the semiconductor substrate 302 (e.g., in the semiconductor substrate 302 exposed by the recess 308). The conductive region 303 may be a portion of conductive routes and has exposed surfaces that may be treated by a planarization process, such as chemical mechanical polishing. Suitable materials for the conductive region 303 may include, but not limited to, for example copper, aluminum, copper alloy, or other mobile conductive materials. The semiconductor substrate 302 containing such a copper conductive region 303 may be the first or any subsequent metallization layer of the semiconductor device 300.

The etch stop layer 304 functions for controlling the end point during subsequent etching processes. In some embodiments, the etch stop layer 304 is formed of silicon oxide, silicon nitride, silicon carbide, silicon oxynitride or combinations thereof. In some embodiments, the etch stop layer 304 has a thickness of about 10 angstroms to about 1000 angstroms. The etch stop layer 304 is formed through any of a variety of deposition techniques, including, LPCVD (low-pressure chemical vapor deposition), APCVD (atmospheric-pressure chemical vapor deposition), PECVD (plasma-enhanced chemical vapor deposition), PVD (physical vapor deposition), sputtering, and future-developed deposition procedures.

The dielectric layer 306 may be a single layer or a multi-layered structure. In some embodiments, the dielectric layer 306 with a thickness varies with the applied technology, for example a thickness of about 1000 angstroms to about 30000 angstroms. In some embodiments, the dielectric layer 306 is silicon oxide, carbon-doped silicon oxide, a comparatively low dielectric constant (k value) dielectric material with a k value less than about 4.0, or combinations thereof. In some embodiments, the dielectric layer 306 is formed of a material, including low-k dielectric material, extreme low-k dielectric material, porous low-k dielectric material, and combinations thereof. The term "low-k" is intended to define a dielectric constant of a dielectric material of 3.0 or less. The term "extreme low-k (ELK)" means a dielectric constant of 2.5 or less, and preferably between 1.9 and 2.5. The term "porous low-k" refers to a dielectric constant of a dielectric material of 2.0 or less, and preferably 1.5 or less. A wide variety of low-k materials may be employed in accordance with embodiments, for example, spin-on inorganic dielectrics, spin-on organic dielectrics, porous dielectric materials, organic polymer, organic silica glass, FSG (SiOF series material), HSQ (hydrogen silsesquioxane) series material, MSQ (methyl silsesquioxane) series material, or porous organic series material. In some embodiments, the dielectric layer 306 is deposited through any of a variety of techniques, such as chemical vapor deposition (CVD), physical vapor deposition (PVD), atomic layer deposition (ALD), remote plasma enhanced chemical vapor deposition (RPECVD), liquid source misted chemical deposition (LSMCD), coating, spin-coating or another process that is adapted to form a thin film layer over the substrate.

In embodiments, the dielectric layer 306 is a nitrogen-containing layer, a carbon-containing layer, or a carbon-containing and nitrogen-containing layer for increasing corrosion resistance during a subsequent chemical mechanical polishing (CMP) process and/or increasing electromigration resistance. In one embodiment, the dielectric layer 306 is a silicon-containing and nitrogen-containing dielectric layer. In another embodiment, the dielectric layer 306 is a silicon-containing and carbon-containing dielectric layer. In yet another embodiment, the dielectric layer 306 is a silicon-containing, nitrogen-containing, and carbon-containing dielectric layer. In one embodiment, the dielectric layer 306 has a ratio by weight of carbon to silicon about equal or greater than 0.5. In another embodiment, the dielectric layer 306 has a ratio by weight of nitrogen to silicon about equal or greater than 0.3. In yet another embodiment, the dielectric layer 306 has a ratio by weight of carbon to silicon about equal or greater than 0.5 and a ratio by weight of nitrogen to silicon about equal or greater than 0.3.

The recess 308 is an example dual damascene opening including an upper trench section 308U and a lower via-hole section 308L. The recess 308 is patterned in the dielectric layer 306 and the etch stop layer 304 to define a contact region on the semiconductor substrate 302. Although the embodiments illustrate dual damascene openings in the IMD layer, the use of single damascene openings in the IMD layer also provide values. In dual damascene techniques including a "via-first" patterning method or a "trench-first" patterning method, the upper trench section 308U and the lower via-hole section 308L may be formed using a typical lithographic with masking technologies and anisotropic etch operation (e.g. plasma etching or reactive ion etching). In alternative embodiments, a bottom etch stop layer (not shown), a middle etch stop layer (not shown), a polish stop layer (not shown), or an anti-reflective coating (ARC) layer (not shown) is deposited on or intermediately in the dielectric layer 306, providing a clear indicator of when to end a particular etching process.

Figure 13:
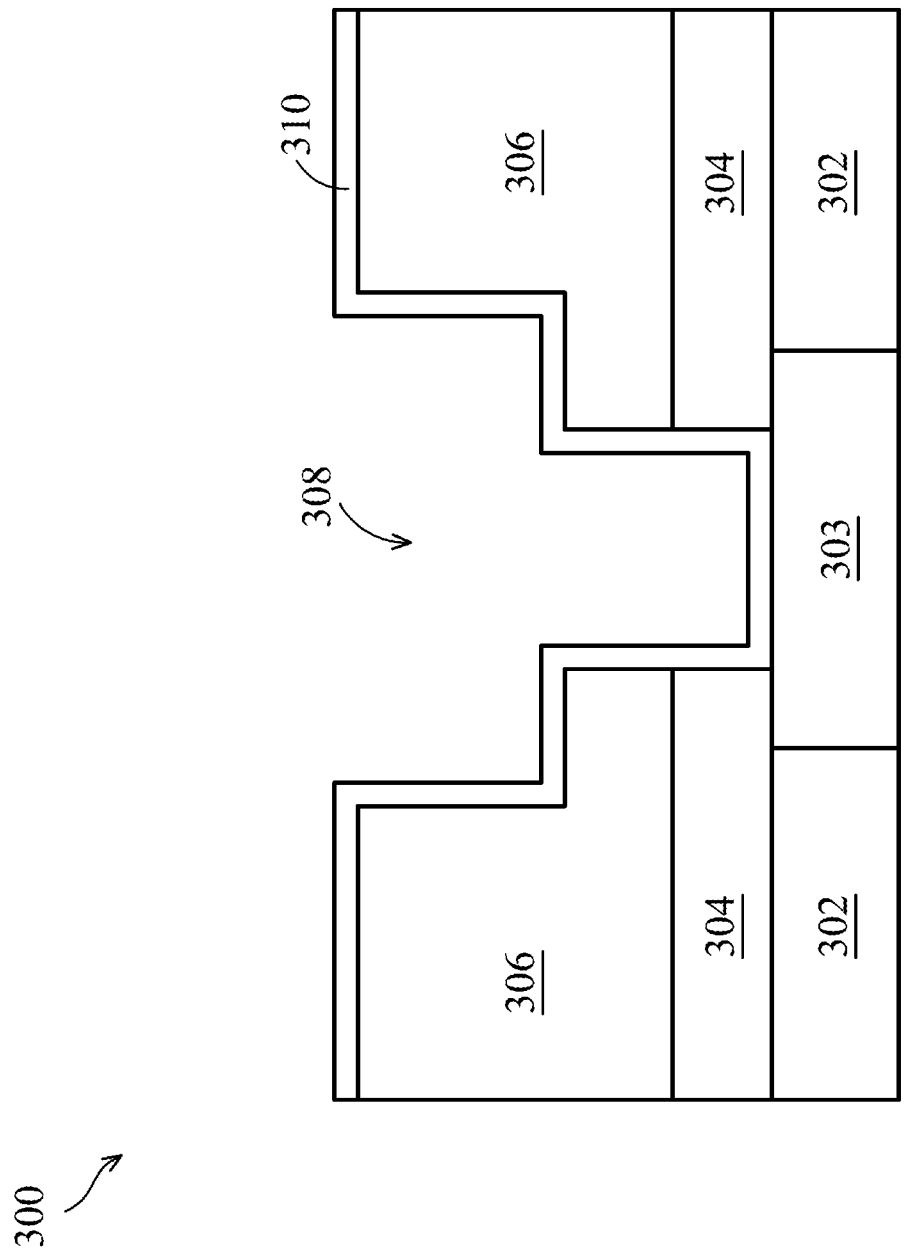

Referring to FIGS. 11 and 13, the method 1100 proceeds to step 1104 in which a barrier layer 310 is formed on the above-described structure to line the sidewalls and bottoms of the recess cavities 308 and over the dielectric layer 306. In some embodiments, the barrier layer 310 may be optional. The barrier layer 310 may function as a barrier to prevent a subsequently formed conductor from diffusing into the underlying dielectric layer 306. In some embodiments, the barrier layer 310 includes a metal material such as, for example, tantalum (Ta), titanium (Ti), tungsten (W), and titanium (Ti). In some embodiments, the barrier layer 310 includes a compound or an alloy of the above-identified metal materials such as, for example, tantalum nitride (TaN), tantalum nitride silicon (TaNSi), titanium tungsten (TiW), and titanium nitride silicon (TiNSi). In some embodiments, the barrier layer 310 has a thickness of about 10 angstrom to about 250 angstroms.

Figure 14:
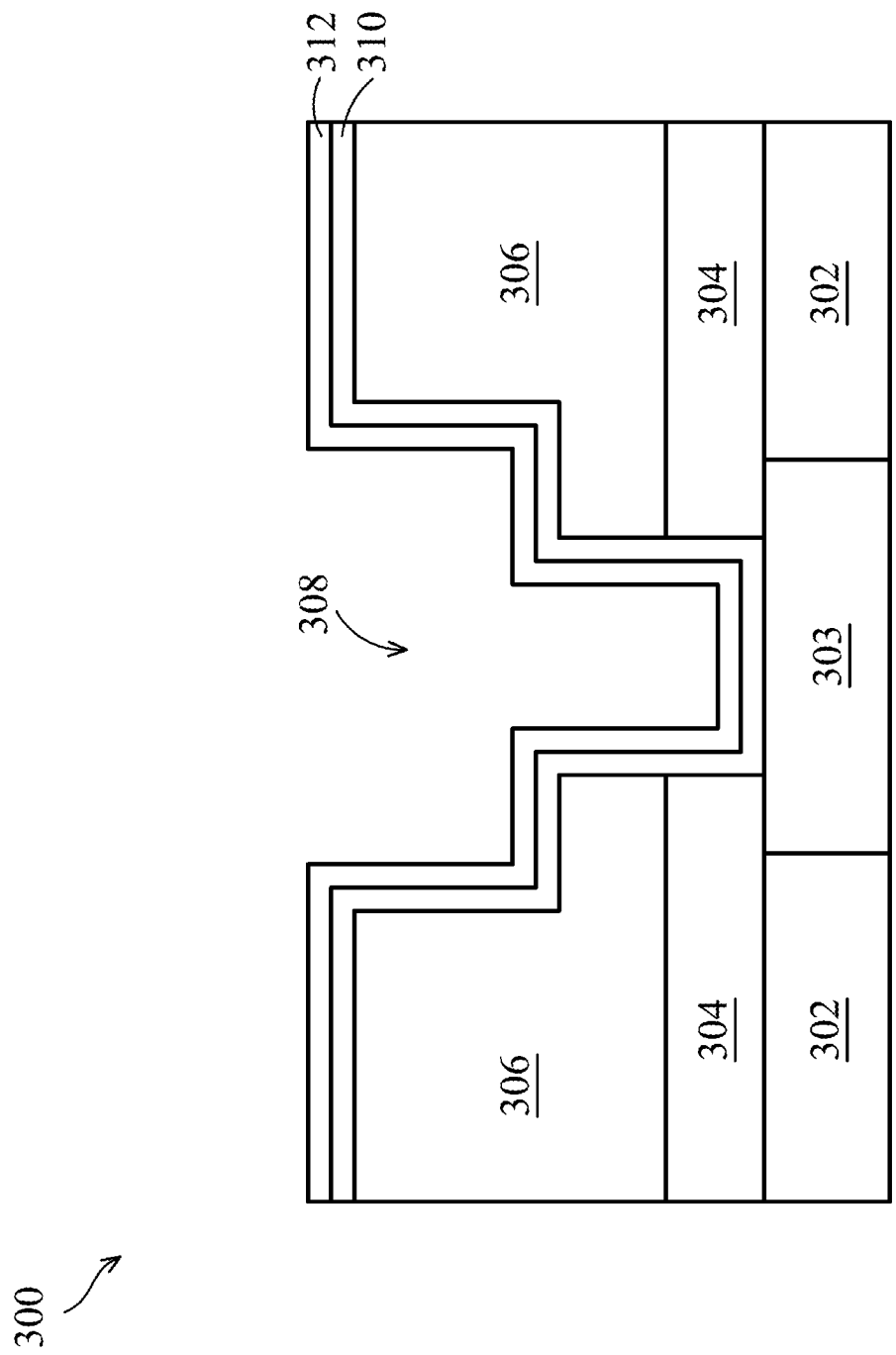

Referring to FIGS. 11 and 14, the method 1100 proceeds to step 1106 in which a first metal material 312 is formed on the above-described structure to line the sidewalls and bottoms of the recess 308 and over the barrier layer 310 (if formed). As the optional barrier layer 310 is not formed, the first metal material 312 may be in direct contact with the sidewalls and bottoms of the recess cavities 308 and over the dielectric layer 306. The first metal material 312 includes at least one material selected from the group consisting of: cobalt (Co), ruthenium (Ru), tantalum (Ta), titanium (Ti), tungsten (W), molybdenum (Mo), zinc (Zn), aluminum (Al), and manganese (Mn). In some embodiments, the first metal material 312 has a thickness of about 1 angstrom to about 80 angstroms. In some embodiments, the first metal material 312 has a thickness ranging from about 2.5 angstroms to about 25 angstroms. In some embodiments, the first metal material 312 is deposited by using physical vapor deposition (PVD), chemical vapor deposition (CVD), plasma enhanced CVD (PECVD), low pressure CVD (LPCVD), atomic layer deposition (ALD), or other well-known deposition techniques.

Figure 15:
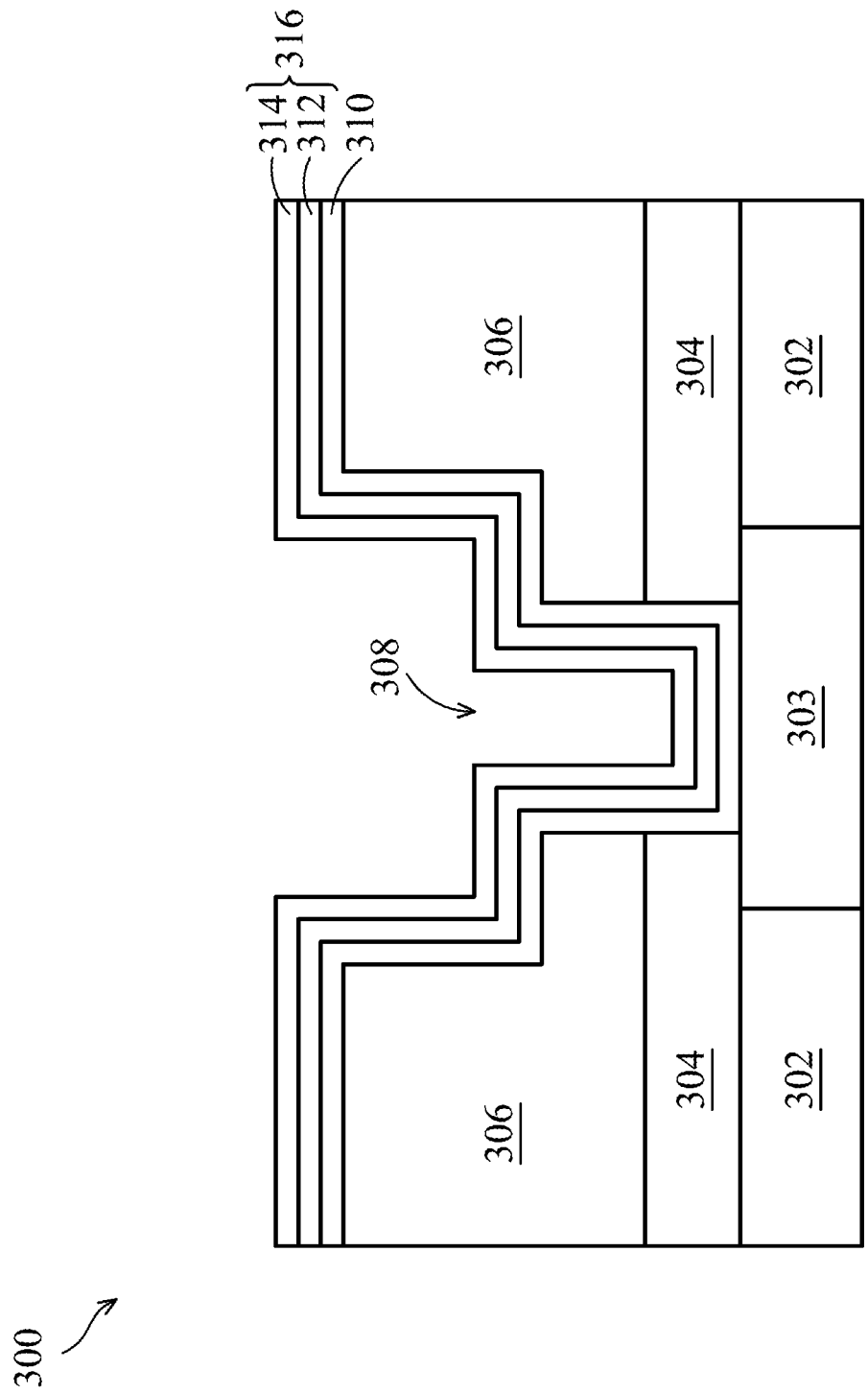

Referring to FIGS. 11 and 15, the method 1100 proceeds to step 1108 in which a second metal material 314 is formed on the above-described structure to line the sidewalls and bottoms of the recess 308 and over the first metal material 312. The second metal material 314 includes at least one material selected from the group consisting of: cobalt (Co), ruthenium (Ru), tantalum (Ta), titanium (Ti), tungsten (W), molybdenum (Mo), zinc (Zn), aluminum (Al), and manganese (Mn). In some embodiments, the second metal material 314 is formed of a material different from the first metal material 312. As such, the first metal material 312 and second metal material 314 may form an alloy liner structure, hereinafter alloy liner structure 316. Although the alloy liner structure 316 is shown as a stack of two layers in FIG. 15 (and the following figures), it is understood that the alloy liner structure 316 can be formed as a stack of any number of layers, each of which includes one of the above-listed metal materials (e.g., Co, Ru, Ta, Ti, W, Mo, Zn, Al, Mn), while remaining within the scope of the present disclosure. For example, the alloy liner structure 316, formed as a stack of two layers, may include an alloy selected from the group consisting of: CoRu, CoTa, CoTi, CoMn, CoMo, CoZn, CoAl, CoW, RuTa, RuTi, RuW, RuMo, RuZn, RuAl, and RuMn. In some embodiments, the second metal material 314 has a thickness of about 1 angstrom to about 80 angstroms. In some embodiments, the second metal material 314 has a thickness ranging from about 2.5 angstroms to about 25 angstroms. In some embodiments, a total thickness of the first metal material 312 and second metal material 314 may range from about 5 angstroms to about 50 angstroms. In some embodiments, the second metal material 314 is deposited by using physical vapor deposition (PVD), chemical vapor deposition (CVD), plasma enhanced CVD (PECVD), low pressure CVD (LPCVD), atomic layer deposition (ALD), or other well-known deposition techniques.

Figure 16:
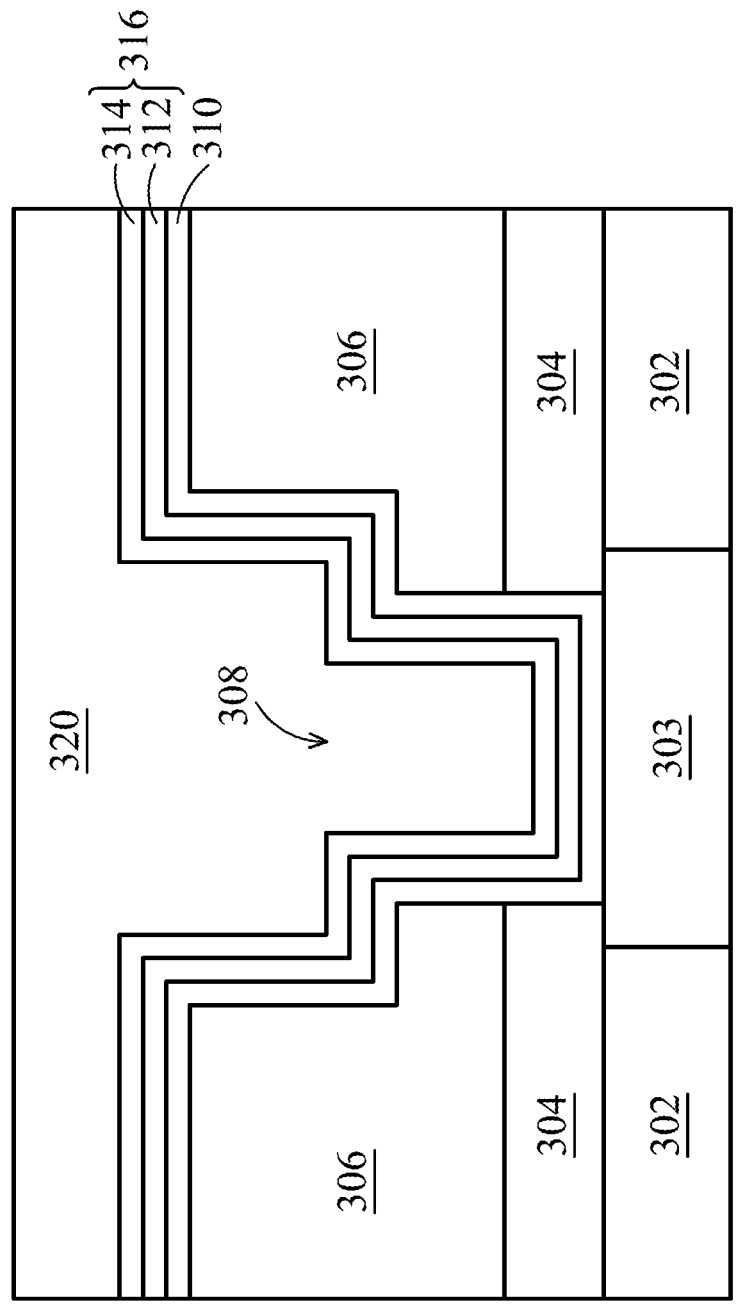

Referring to FIGS. 11 and 16, the method 1100 proceeds to step 1110 in which a third metal material 320 is formed over the alloy liner structure 316 to fill the recess 308. In some embodiments, the third metal material 320 is formed as an interconnect structure in the dielectric layer 306. In some embodiments, the third metal material 320 is deposited by an electro-chemical plating (ECP) process, physical vapor deposition (PVD), chemical vapor deposition (CVD), plasma enhanced CVD (PECVD), low pressure CVD (LPCVD), atomic layer deposition (ALD), or other well-known deposition techniques. In some embodiments, the third metal material 320 at least contains a main metal element, e.g., copper (Cu). In some embodiments, the third metal material 320 further contains an additive metal element. In some embodiments, the additive metal element in the third metal material 320 is tantalum (Ta), indium (In), tin (Sn), zinc (Zn), manganese (Mn), chromium (Cr), titanium (Ti), germanium (Ge), strontium (Sr), platinum (Pt), magnesium (Mg), aluminum (Al), or zirconium (Zr).

Figure 17:
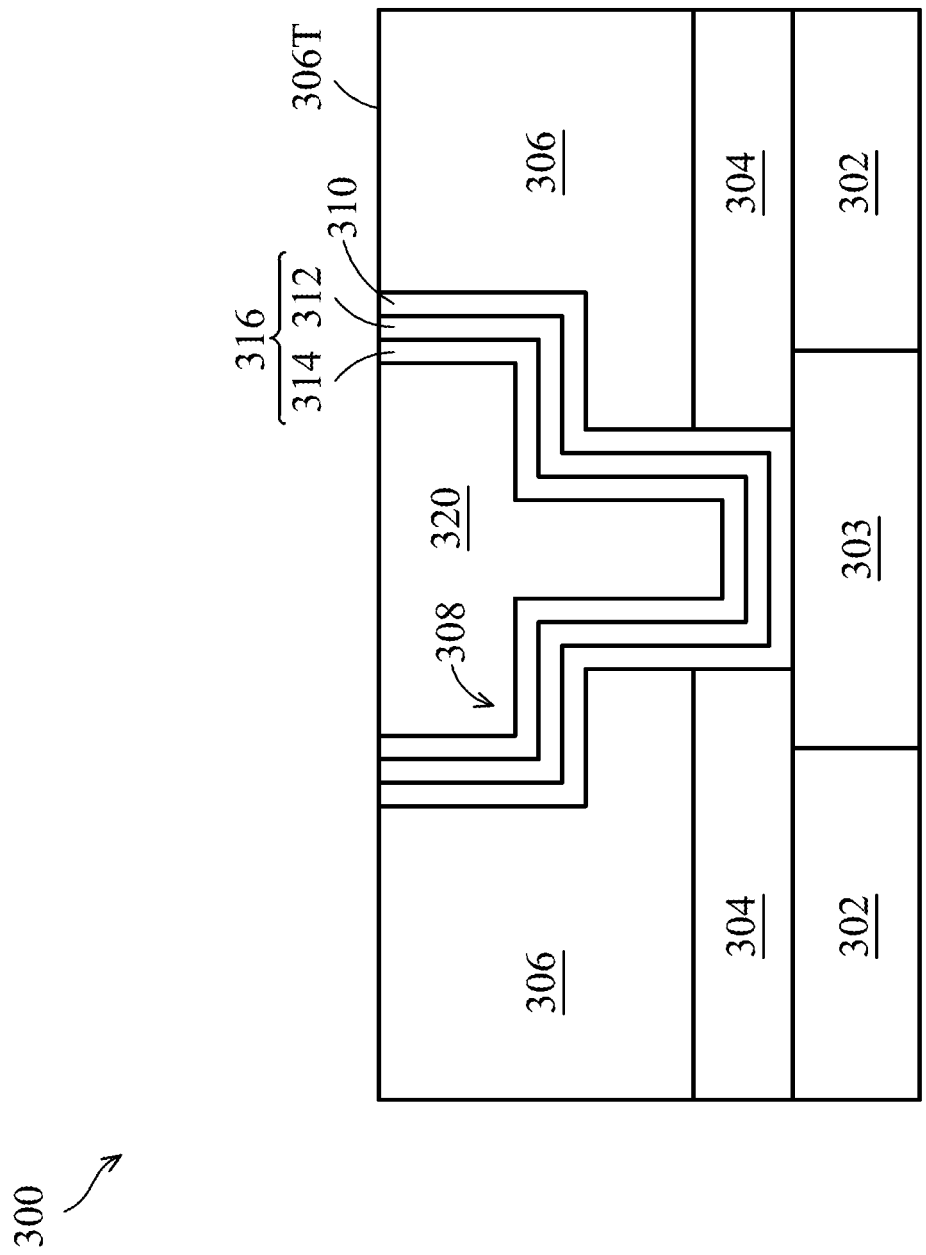

Referring to FIGS. 11 and 17, the method 100 proceeds to step 1112 in which a portion of the third metal material 320 over the dielectric layer 306 is removed. In some embodiments, the removing process is chemical mechanical polishing (CMP) process performed to remove the excess portions of the third metal material 320, the alloy liner structure 316, and the optional barrier layer 310 outside the recess 308, thus exposing top boundary 306T of the dielectric layer 306 and achieving a planarized surface.

Figure 18:
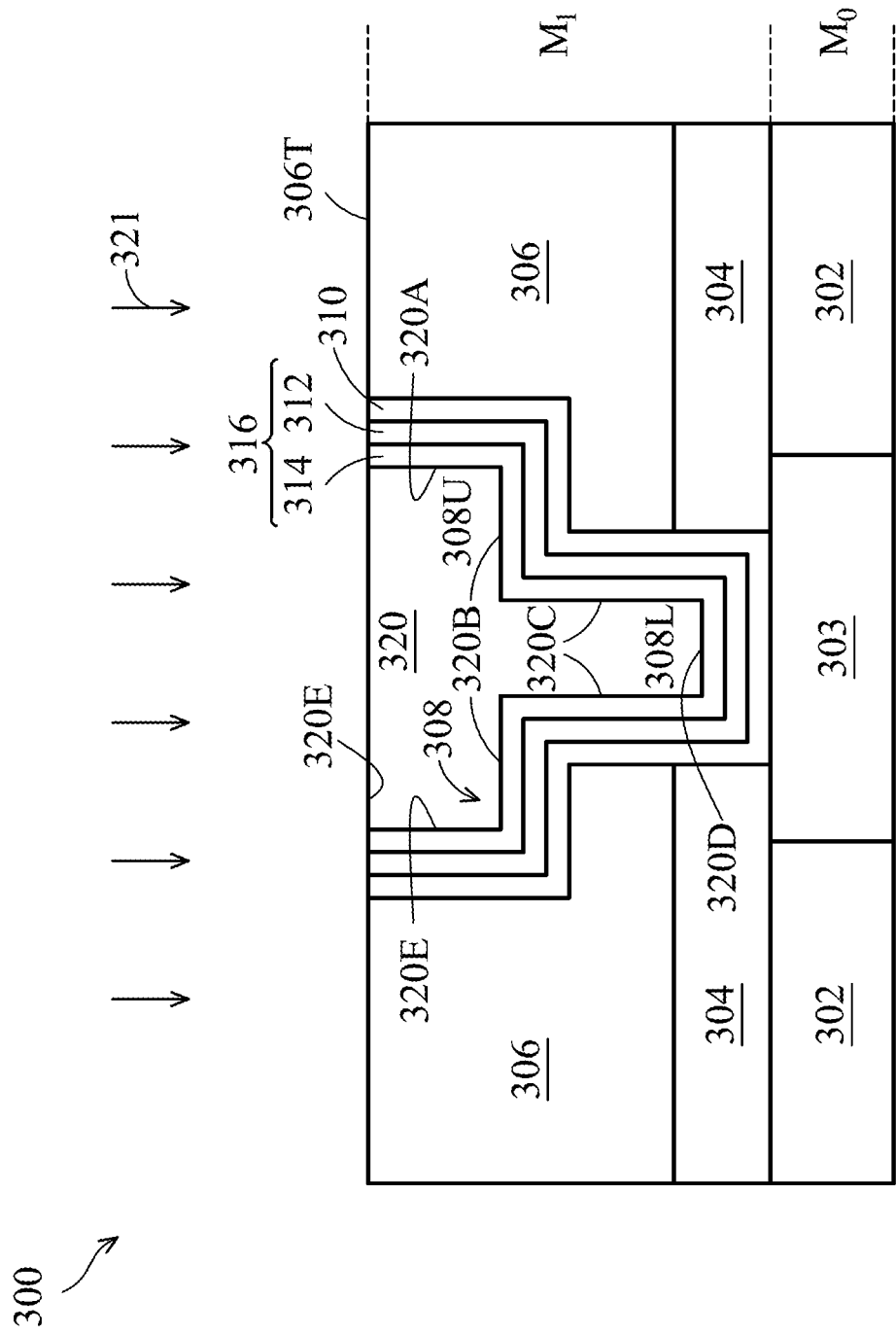

Referring to FIGS. 11 and 18, the method 1100 proceeds to step 1114 in which a thermal treatment 321 is optionally performed on the semiconductor device 300. In some embodiments, the thermal treatment 321 includes an annealing process. In one embodiment, the thermal treatment 321 is performed at a temperature ranged from about 137° C. to about 600° C. In another embodiment, the thermal treatment 321 is performed at a temperature ranged from about 280° C. to about 400° C. In one embodiment, the thermal treatment 321 is performed at a duration ranged from about 10 minutes to about 600 minutes. In some embodiments, the thermal treatment 321 is performed using furnace, rapid thermal processing (RTP), or hot plate equipment. In various alternative embodiments, the thermal treatment 321 is provided at the time immediately after the formation of the second metal material 314, immediately after the CMP to remove the excess portions of the second metal material 314 outside the recess 308, or immediately after forming a passivation layer on a top metal layer.

Similarly as the method 100, it is noted that the method 1100 may be iteratively performed to form one or more subsequent metallization layers of the semiconductor device 300. As such, the third metal material 320 may be disposed (or embedded) in a metallization layer (indicated as M1 in FIG. 18) between a lower metallization layer (e.g., the metallization layer where the conductive region 303 is formed, which is indicated as M0 in FIG. 18) and an upper metallization layer (not shown). In some embodiments, the third metal material 320, which is at least partially wrapped by the alloy liner structure 316 in M1 and another alloy liner structure in the next upper metallization layer (e.g., M2), is configured as interconnect structure to electrically connect the conductive feature 303 to another conductive feature disposed (or embedded) in the upper metallization layer. As such, the third metal material 320 is herein referred to as "interconnect structure 320." As the interconnect structure 320 fills the recess 308 having the upper trench portion 308U and the lower via-hole portion 308L, the interconnect structure 320 can inherit the shape of the recess 308 to include a trench portion filling the upper trench portion 308U and a via portion filling the lower via-hole portion 308L. The trench portion and the via portion of the interconnect structure 320 are in direct contact with each other to form an integral piece, in some embodiments.

In some embodiments, the alloy liner structure 316 is extended along some of the boundaries of the interconnect structure 320 that is embedded in (or not exposed by) the metallization layer M1, which includes the dielectric layer 306 and the etch stop layer 304. For example in FIG. 18, the alloy liner structure 316 is extended along boundaries 320A, 320B, 320C, and 320D in the metallization layer M1. Although not shown, it should be understood that another alloy liner structure embedded in the next higher metallization layer (e.g., M2) may be extended along boundary 320E of the interconnect structure 320.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In an embodiment, a semiconductor device includes an interconnect structure embedded in a first metallization layer comprising a dielectric material. The interconnect structure includes a first metal material. The semiconductor device includes a first liner structure embedded in the first metallization layer. The first liner structure is extended along one or more boundaries of the interconnect structure in the first metallization layer. The first liner structure includes a second metal material reacted with one or more dopants, the second metal material being different from the first metal material.

In another embodiment, a semiconductor device includes an interconnect structure embedded in a first metallization layer that includes a dielectric material. The interconnect structure includes a first metal material. The semiconductor device includes a first liner structure embedded in the first metallization layer. The first liner structure is extended along one or more boundaries of the interconnect structure in the first metallization layer. The first liner structure comprises an alloy of at least a first one and a second one of a plurality of second metal materials different from the first metal material.

In yet another embodiment, a method for forming a semiconductor device includes forming a cavity at least partially extending through a dielectric layer. The method includes forming a liner structure extending along the cavity. The liner structure includes either a first metal material passivated by a plasma process or an alloy of a second metal material and a third metal material. The method includes filling the cavity with a fourth metal material to form an interconnect structure. The fourth metal material is different from each of the first metal material, the second metal material, and the third metal material.

What is claimed is:

1. A semiconductor device, comprising:
   an interconnect structure embedded in a first metallization layer, the first metallization layer comprising an inter-metal dielectric material, and the interconnect structure comprising a first metal material; and
   a first liner structure embedded in the first metallization layer,
   wherein the first liner structure comprises a second layer over a first layer, the second layer in its entirety being in direct contact with each boundary of the interconnect structure disposed within the first metallization layer, and the first layer having a different composition from the second layer,
   wherein a topmost portion of a sidewall of the first layer is in direct contact with at least a portion of the inter-metal dielectric material, and
   wherein the second layer of the first liner structure comprises a carbide-based metal structure comprising a second metal material, the second metal material being different from the first metal material and comprising cobalt (Co).

2. The semiconductor device of claim 1, wherein the second metal material further comprises at least one material selected from the group consisting of: ruthenium (Ru), tantalum (Ta), titanium (Ti), tungsten (W), molybdenum (Mo), zinc (Zn), aluminum (Al), and manganese (Mn).

3. The semiconductor device of claim 1, wherein the carbide-based metal structure comprises at least one material selected from the group consisting of: $CoC_x$, CoC, $Co_2C$, and $Co_3C$.

4. The semiconductor device of claim 3, further comprising:
   a second liner structure embedded in a second metallization layer over the first metallization layer, wherein the second liner structure comprises the second metal material reacted with the carbon in the carbide-based metal structure.

5. The semiconductor device of claim 4, wherein the interconnect structure is wrapped by the first and second liner structures.

6. The semiconductor device of claim 4, wherein the interconnect structure has a portion in direct contact with the second liner structure.

7. The semiconductor device of claim 1, wherein the first metal material includes copper (Cu).

8. The semiconductor device of claim 1, wherein the second metal material is reacted with carbon through a plasma process.

9. The semiconductor device of claim 8, wherein the plasma process includes at least one plasma process selected from the group consisting of: a hydrogen plasma process, a nitrogen plasma process, an ammonia plasma process, and a methanol plasma process.

10. The semiconductor device of claim 1, wherein the first layer of the first liner structure comprises at least one material selected from the group consisting of: tantalum nitride (TaN), tantalum nitride silicon (TaNSi), titanium tungsten (TiW), and titanium nitride silicon (TiNSi).

11. A semiconductor device, comprising:
    a first metallization layer comprising an interconnect structure disposed in an inter-metal dielectric layer, the interconnect structure comprising a first metal; and
    a first liner structure disposed in the first metallization layer, the first liner structure comprising a first layer and a second layer disposed over the first layer,
    wherein the first layer and the second layer have different compositions,
    wherein an entirety of the second layer is in direct contact with each boundary of the interconnect structure,
    wherein at least a topmost portion of a sidewall of the first layer is in direct contact with the inter-metal dielectric layer, and wherein the second layer comprises a first metal carbide having a second metal that is different from the first metal, the second metal comprising cobalt (Co).

12. The semiconductor device of claim 11, wherein the second metal further comprises at least one material selected from the group consisting of: ruthenium (Ru), tantalum (Ta), titanium (Ti), tungsten (W), molybdenum (Mo), zinc (Zn), aluminum (Al), and manganese (Mn).

13. The semiconductor device of claim 11, wherein the first metal carbide comprises at least one material selected from the group consisting of: $CoC_x$, CoC, $Co_2C$, and $Co_3C$.

14. The semiconductor device of claim 11, wherein the first layer comprises at least one material selected from the group consisting of: tantalum nitride (TaN), tantalum nitride silicon (TaNSi), titanium tungsten (TiW), and titanium nitride silicon (TiNSi).

15. The semiconductor device of claim 11, further comprising a second metallization layer disposed over the first metallization layer, the second metallization layer comprising a second liner structure, wherein the second liner structure comprises a second metal carbide having the second metal.

16. The semiconductor device of claim 15, wherein the interconnect structure is surrounded by the first and second liner structures.

17. A semiconductor device, comprising:
  a first metallization layer comprising an interconnect structure disposed in an inter-metal dielectric layer, the interconnect structure comprising a first metal; and
  a first liner structure disposed in the first metallization layer and extending between the interconnect structure and the inter-metal dielectric layer,
  wherein the first liner structure comprises a first layer and a second layer disposed over the first layer, the first layer and the second layer having different compositions,
  wherein an entirety of the second layer is in direct contact with each surface of the interconnect structure,
  wherein a topmost portion of a sidewall of the first layer is in direct contact with the inter-metal dielectric layer, and
  wherein the second layer comprises a metal carbide material having a second metal that is different from the first metal, the second metal comprising cobalt (Co).

18. The semiconductor device of claim 17, wherein the metal carbide material comprises at least one material selected from the group consisting of: $CoC_x$, CoC, $Co_2C$, and $Co_3C$.

19. The semiconductor device of claim 17, wherein the second metal further comprises at least one material selected from the group consisting of: ruthenium (Ru), tantalum (Ta), titanium (Ti), tungsten (W), molybdenum (Mo), zinc (Zn), aluminum (Al), and manganese (Mn).

20. The semiconductor device of claim 17, wherein the first layer comprises at least one material selected from the group consisting of: tantalum nitride (TaN), tantalum nitride silicon (TaNSi), titanium tungsten (TiW), and titanium nitride silicon (TiNSi).

* * * * *